US008571116B2

(12) United States Patent
Sato et al.

(10) Patent No.: US 8,571,116 B2
(45) Date of Patent: *Oct. 29, 2013

(54) CODING DEVICE AND METHOD, DECODING DEVICE AND METHOD, RECORDING MEDIUM, AND PROGRAM

(75) Inventors: Kazushi Sato, Chiba (JP); Teruhiko Suzuki, Chiba (JP); Osamu Sunohara, Tokyo (JP); Yoichi Yagasaki, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/546,666

(22) Filed: Jul. 11, 2012

(65) Prior Publication Data

US 2012/0275523 A1 Nov. 1, 2012

Related U.S. Application Data

(63) Continuation of application No. 12/468,912, filed on May 20, 2009, now Pat. No. 8,325,820, which is a continuation of application No. 10/509,682, filed as application No. PCT/JP03/05081 on Apr. 22, 2003, now Pat. No. 7,778,331.

(30) Foreign Application Priority Data

Apr. 26, 2002 (JP) ................................. 2002-125295

(51) Int. Cl.
*H04N 7/12* (2006.01)
(52) U.S. Cl.
USPC ................................. 375/240.26; 375/240.16
(58) Field of Classification Search
USPC ........................................ 375/240.26, 240.16
See application file for complete search history.

(56) References Cited

U.S. PATENT DOCUMENTS

| 6,005,980 A | 12/1999 | Eifrig et al. |
| 6,272,179 B1 | 8/2001 | Kadono |
| 6,654,420 B1 | 11/2003 | Snook |

FOREIGN PATENT DOCUMENTS

| JP | 10-98732 A | 4/1998 |
| JP | 10-136372 | 5/1998 |
| JP | 10-229564 | 8/1998 |
| JP | 11-164303 | 6/1999 |
| JP | 2003-319391 A | 11/2003 |
| JP | 2006-352911 A | 12/2006 |
| JP | 2008-92593 A | 4/2008 |

(Continued)

OTHER PUBLICATIONS

Japanese Office Action issued Sep. 11, 2012 in Patent Application No. 2010-166190.

(Continued)

*Primary Examiner* — Anner Holder
(74) *Attorney, Agent, or Firm* — Oblon, Spivak, McClelland, Maier & Neustadt, L.L.P.

(57) ABSTRACT

An encoding apparatus and an encoding method, a decoding apparatus and a decoding method, a recording medium, and a program suitable for encoding image signals with a higher compression ratio for transmission or accumulation. In an arithmetic coding section, from among the syntax elements of input image compression information, the frame/field flag is first encoded by a frame/field flag context model. When the macroblock to be processed is subjected to frame-based encoding, a frame-based context model, specified in the current H.26L standard, is applied. On the other hand, when the macroblock to be processed is subjected to field-based encoding, a field-based context model is applied for the syntax elements described below. The present invention is applied to an encoder for encoding image information and a decoder for decoding image information.

2 Claims, 26 Drawing Sheets

(56) References Cited

FOREIGN PATENT DOCUMENTS

| JP | 2008-104205 A | 5/2008 |
|---|---|---|
| WO | WO 01/33864 | 5/2001 |
| WO | WO 02/084990 | 10/2002 |

OTHER PUBLICATIONS

Japanese Office Action issued Sep. 11, 2012 in Patent Application No. 2010-166191.
Japanese Office Action issued Sep. 11, 2012 in Patent Application No. 2010-166192.
Japanese Office Action issued Sep. 13, 2012 in Patent Application No. 2010-166193.
Office Action issued Jan. 17, 2013 in Japanese Patent Application No. 2012-182451.
Wang et al., Interlace Coding Tools for H.26L Video Coding. ITU-Telecommunications Standardization Sector Study Group 16 Question 6 Video Coding Experts Group (VGEG) VCEG-037, Dec. 4-6, 2001.
Marpe et al., Adaptive Codes for H. 26L. ITU-Telecommunication Standarization Sector Study Group Question 6 Video Coding Experts Group (VCEG) VCEG-L13, Jan. 9-12, 2001.
Marpe et al., Video Compression Using Context-Based Adaptive Arithmetic Coding In: Image Processing, 2001, Oct. 7-10, 2001.
Ian H. Witten, et al., "Arithmetic Coding for Data Compression", Communication of the ACM, Association for Computing Machinery, vol. 30, No. 6, 1987, pp. 520-540.
Office Action issued Jan. 17, 2012, in Japanese Patent Application No. 2007-281033, filed Oct. 25, 2007.
Office Action issued Jan. 17, 2012, in Japanese Patent Application No. 2007-281034, filed Oct. 25, 2007.
U.S. Appl. No. 13/558,554, filed Jul. 26, 2012, Sato, et al.
U.S. Appl. No. 13/558,758, filed Jul. 26, 2012, Sato, et al.
U.S. Appl. No. 13/559,117, filed Jul. 26, 2012, Sato, et al.
U.S. Appl. No. 13/559,066, filed Jul. 26, 2012, Sato, et al.
U.S. Appl. No. 13/558,712, filed Jul. 26, 2012, Sato, et al.
U.S. Appl. No. 13/619,759, filed Sep. 14, 2012, Sato, et al.
U.S. Appl. No. 13/619,975, filed Sep. 14, 2012, Sato, et al.
U.S. Appl. No. 13/619,779, filed Sep. 14, 2012, Sato, et al.
Supplementary European Search Report issued Jul. 24, 2013 in European Patent Application No. 03717684.9.
Extended European Search Report issued Jul. 24, 2013 in European Patent Application No. 13164839.6.
Extended European Search Report issued Jul. 24, 2013 in European Patent Application No. 13166278.5.
Extended European Search Report issued Jul. 24, 2013 in European Patent Application No. 13166271.0.
Thomas Wiegand, "Working Draft No. 2, Revision 2 (WD-2) H.26L", 2. JVT Meeting, Jan. 29-Feb. 1, 2002, Geneva, Switzerland, Joint Video Team (JVT) of ISO/IEC MPEG and ITU-T VCEG, No. JVT-B118r2, Feb. 1, 2002, XP030005112, 106 pages.
Peter Borgwardt, "Core Experiment on Macroblock Adaptive Frame/Field Encoding", 2. JVT Meeting, Jan. 29-Feb. 1, 2002, Geneva, CH, Joint Video Team (JVT) of ISO/IEC MPEG and ITU-T VCEG (ISO/IEC JTC1/SC29/VVG11 and ITU-T SG16 Q.6) No. JVT-B117, Feb. 1, 2002, XP030005111, 7 pages.

FIG. 3
BACKGROUND ART

| SYMBOL | OCCURRENCE PROBABILITY | SUBINTERVAL |
|---|---|---|
| $S_1$ | 0.20 | $0.00 \leq x < 0.20$ |
| $S_2$ | 0.10 | $0.20 \leq x < 0.30$ |
| $S_3$ | 0.30 | $0.30 \leq x < 0.60$ |
| $S_4$ | 0.05 | $0.60 \leq x < 0.65$ |
| $S_5$ | 0.10 | $0.65 \leq x < 0.75$ |
| $S_6$ | 0.20 | $0.75 \leq x < 0.95$ |
| $S_7$ | 0.05 | $0.95 \leq x < 1.00$ |

| I | A | B | C | D |
|---|---|---|---|---|
| E | a | b | c | d |
| F | e | f | g | h |
| G | i | j | k | l |
| H | m | n | o | p |

FIG. 12
BACKGROUND ART

| Ctx_run_level | Block Type |
|---|---|
| 0 | Double Scan |
| 1 | Single Scan, Inter |
| 2 | Single Scan, Intra |
| 3 | Intra16x16, DC |
| 4 | Intra16x16, AC |
| 5 | Chroma, DC, Inter |
| 6 | Chroma, DC, Intra |
| 7 | Chroma, AC, Inter |
| 8 | Chroma, AC, Intra |

FIG. 13
*BACKGROUND ART*

| Code symbol | Binarization |
|---|---|
| 0 | 1 |
| 1 | 0 1 |
| 2 | 0 0 1 |
| 3 | 0 0 0 1 |
| 4 | 0 0 0 0 1 |
| 5 | 0 0 0 0 0 1 |
| 6 | 0 0 0 0 0 0 1 |
| ... | . . . . . . . |
| Bin no. | 1 2 3 4 5 6 7 ... |

FIG. 14A
BACKGROUND ART

| P_MB_type | Binarization |
|---|---|
| 0 | 0 |
| 1 | 1 0 0 |
| 2 | 1 0 1 |
| 3 | 1 1 0 0 0 |
| 4 | 1 1 0 0 1 |
| 5 | 1 1 0 1 0 |
| 6 | 1 1 0 1 1 |
| 7 | 1 1 1 0 0 |
| 8 | 1 1 1 0 1 |
| 9 | 1 1 1 1 0 |
| Bin no. | 1 2 3 4 5 |

FIG. 14B
BACKGROUND ART

| B_MB_type | Binarization |
|---|---|
| 0 | 0 |
| 1 | 1 0 0 |
| 2 | 1 0 1 |
| 3 | 1 1 0 0 0 |
| 4 | 1 1 0 0 1 |
| 5 | 1 1 0 1 0 |
| 6 | 1 1 0 1 1 |
| 7 | 1 1 1 0 0 0 0 |
| . | . |
| 17 | 1 1 1 0 1 0 |
| Bin no. | 1 2 3 4 5 6 7 |

| P_MB_type | Binarization |
|---|---|
| 0 | 0 |
| 1 | 1 0 0 |
| 2 | 1 0 1 |
| 3 | 1 1 0 0 0 |
| 4 | 1 1 0 0 1 |
| 5 | 1 1 0 1 0 |
| 6 | 1 1 0 1 1 |
| 7 | 1 1 1 0 0 |
| Bin no. | 1 2 3 4 5 |

FIG. 28B

| B_MB_type | Binarization |
|---|---|
| 0 | 0 |
| 1 | 1 0 0 |
| 2 | 1 0 1 |
| 3 | 1 1 0 0 0 |
| 4 | 1 1 0 0 1 |
| 5 | 1 1 0 1 0 |
| 6 | 1 1 0 1 1 |
| 7 | 1 1 1 0 0 0 0 |
| ... | ... |
| 13 | 1 1 1 0 1 1 0 |
| Bin no. | 1 2 3 4 5 6 7 |

CODING DEVICE AND METHOD, DECODING DEVICE AND METHOD, RECORDING MEDIUM, AND PROGRAM

CROSS-REFERENCE TO RELATED APPLICATION

This application is a continuation application of U.S. application Ser. No. 12/468,912, filed May 20, 2009, which is a continuation of application Ser. No. 10/509,682, filed on Oct. 12, 2004, which is now U.S. Pat. No. 7,778,331, which is a National Stage application of PCT/JP03/05081 filed on Apr. 22, 2003, and claims priority to Japanese Patent Application No. JP2002-125295, filed on Apr. 26, 2002. The entire contents of the above-identified applications are incorporated herein by reference.

TECHNICAL FIELD

The present invention relates to an encoding apparatus and an encoding method, a decoding apparatus and a decoding method, a recording medium, and a program. The present invention relates to, for example, an encoding apparatus and an encoding method, a decoding apparatus and a decoding method, a recording medium, and a program suitable for encoding image signals with a higher compression ratio for transmission or accumulation.

BACKGROUND ART

Nowadays, apparatuses in compliance with, for example, MPEG (Moving Picture Expert Group), which is an image compression standard based on orthogonal transformation, such as discrete cosine transformation, and motion compensation where redundancies specific to image information are exploited to handle images as digital signals for efficient transmission and accumulation of such digital signals, are being widely used for both information distribution by broadcast stations and information reception in households.

In particular, the MPEG2 (ISO/IEC 13818-2) compression technique is a standard defined as a general-purpose image compression scheme, covering interlaced scan images and progressive scan images, as well as standard-resolution images and high-definition images. Thus, MPEG2 is widely used by both professionals and general consumers, as seen in, for example, the DVD (Digital Versatile Disk) standards.

The use of the MPEG2 compression scheme accomplishes a high compression ratio and high image quality by assigning bit rates of, for example, 4 to 8 Mbps for interlaced scan images with a standard resolution of 720×480 pixels and bit rates of, for example, 18 to 22 Mbps for interlaced scan images with a high resolution of 1920×1088 pixels. Since MPEG2 is mainly intended for a high quality encoding technique suitable for broadcasting, it does not support an encoding scheme for a higher compression ratio. This is the reason the MPEG4 encoding system has been standardized as an encoding scheme for a higher compression ratio. The image encoding scheme was approved as an international standard ISO/IEC 14496-2 in December 1998.

Furthermore, the standardization of H.26L (ITU-T Q6/16 VCEG), originally intended for image encoding for video conferences, is being promoted by ITU-T (International Telecommunication Union-Telecommunication Standardization Sector).

H.26L is known as a standard which achieves a higher encoding efficiency, though it requires a larger amount of arithmetic operation for encoding processing and decoding processing compared with known encoding schemes such as MPEG2 and MPEG4.

In addition, one of the current MPEG4 activities includes Joint Model of Enhanced-Compression Video Coding, being promoted jointly with ITU-T, for the standardization of an encoding scheme which achieves a higher encoding efficiency based on H.26L and employs functions not supported by H.26L.

A known image information encoding apparatus based on orthogonal transformation, such as discrete cosine transformation or Karhunen-Loeve transform, and motion compensation will now be described with reference to FIG. 1. FIG. 1 shows an example structure of a known image information encoding apparatus.

In the relevant image information encoding apparatus, an input image signal, as an analog signal, is converted to a digital signal by an A/D conversion section 1 and the digital signal is then passed to a picture sorting buffer 2. The picture sorting buffer 2 rearranges frames of the image information from the A/D conversion section 1 according to the GOP (Group of Pictures) structure of the image compression information output by the relevant image information encoding apparatus.

Images that are subjected to intra-encoding (encoding in an image) will first be described. In the picture sorting buffer 2, the image information of an image to be subjected to intra-encoding is passed to an orthogonal transformation section 4 via an adder 3.

In the orthogonal transformation section 4, the image information is subjected to orthogonal transformation (e.g., discrete cosine transformation or Karhunen-Loeve transform), and the obtained transform coefficient is passed to a quantization section 5. In the quantization section 5, the transform coefficient supplied from the orthogonal transformation section 4 is subjected to quantization processing under the control of a rate control section 8 based on the amount of transform coefficient data accumulated in an accumulation buffer 7.

In a lossless encoding section 6, an encoding mode is determined based on the quantized transform coefficient, quantization scale, etc. supplied from the quantization section 5, and the determined encoding mode is subjected to lossless encoding (e.g., variable-length encoding or arithmetic coding) to form information to be stored in the header of an image encoding unit. Furthermore, the encoded encoding mode is supplied to the accumulation buffer 7 for accumulation. The encoded encoding mode accumulated in the accumulation buffer 7 is output to the subsequent stage as image compression information.

In addition, in the lossless encoding section 6, the quantized transform coefficient is subjected to lossless encoding and the encoded transform coefficient is accumulated in the accumulation buffer 7. The encoded transform coefficient, accumulated in the accumulation buffer 7, is also output to the subsequent stage as image compression information.

In a dequantization section 9, the transform coefficient quantized by the quantization section 5 is dequantized. In an inverse orthogonal transformation section 10, the dequantized transform coefficient is subjected to inverse orthogonal transformation processing and decoded image information is generated. The generated decoded image information is accumulated in a frame memory 11.

Images that are subjected to inter-encoding (encoding between images) will now be described. In the picture sorting buffer 2, the image information of an image to be subjected to inter-encoding is supplied to the adder 3 and a motion prediction/compensation section 12.

In the motion prediction/compensation section 12, image information for reference that corresponds to the image from the picture sorting buffer 2 that is subjected to inter-encoding is read out from the frame memory 11 and then subjected to motion prediction/compensation processing to generate reference image information, which is then supplied to the adder 3. Furthermore, motion vector information obtained as a result of motion prediction/compensation processing in the motion prediction/compensation section 12 is supplied to the lossless encoding section 6.

In the adder 3, the reference image information from the motion prediction/compensation section 12 is converted to a differential signal from the image information of the image from the picture sorting buffer that is subjected to inter-encoding.

When an image which is subjected to inter-encoding is to be processed, the differential signal is subjected to orthogonal transformation in the orthogonal transformation section 4, and the obtained transform coefficient is supplied to the quantization section 5. In the quantization section 5, the transform coefficient supplied from the orthogonal transformation section 4 is subjected to quantization processing under the control of the rate control section 8.

In the lossless encoding section 6, an encoding mode is determined based on the transform coefficient and the quantization scale quantized by the quantization section 5, as well as the motion vector information supplied from the motion prediction/compensation section 12 and other information. The determined encoding mode is then subjected to lossless encoding to generate information to be stored in the header of an image encoding unit. The encoded encoding mode is accumulated in the accumulation buffer 7. The encoded encoding mode accumulated in the accumulation buffer 7 is output as image compression information.

Furthermore, in the lossless encoding section 6, motion vector information from the motion prediction/compensation section 12 is subjected to lossless encoding processing to generate information to be stored in the header of the image encoding unit.

When an image which is subjected to inter-encoding is to be processed, the processing in the dequantization section 9 and the subsequent processing are carried out in the same manner as with intra-encoding, and will not be described.

A known image information decoding apparatus which receives image compression information output by the known image information encoding apparatus shown in FIG. 1 to restore an image signal will now be described with reference to FIG. 2. FIG. 2 shows an example structure of a known image information decoding apparatus.

In the relevant image information decoding apparatus, image compression information which has been input is temporarily stored in an accumulation buffer 21 and transferred to a lossless decoding section 22. The lossless decoding section 22 applies lossless decoding (e.g., variable-length decoding or arithmetic decoding) to the image compression information based on a predetermined format of image compression information to acquire the encoding mode information stored in the header and supplies it to a dequantization section 23. The lossless decoding section 22 also acquires the quantized transform coefficient to supply it to the dequantization section 23. Furthermore, if the frame to be decoded has been subjected to inter-encoding, the lossless decoding section 22 also decodes the motion vector information stored in the header of the image compression information and supplies the information to a motion prediction/compensation section 28.

The dequantization section 23 dequantizes the quantized transform coefficient supplied from the lossless decoding section 22, and supplies the obtained transform coefficient to an inverse orthogonal transformation section 24. The inverse orthogonal transformation section 24 applies inverse orthogonal transformation (e.g., inverse discrete cosine transformation or inverse Karhunen-Loeve transform) to the transform coefficient based on a predetermined format of the image compression information.

If the relevant frame has been subjected to intra-encoding, the image information subjected to inverse orthogonal transformation is stored in a picture sorting buffer 26 via an adder 25, converted to an analog signal by a D/A conversion section 27, and then output to the subsequent stage. The image information subjected to inverse orthogonal transformation is also stored in a frame memory 29.

Furthermore, if the relevant frame has been subjected to inter-encoding, a reference image is generated in the motion prediction/compensation section 28 based on the motion vector information from the lossless decoding section 22 and the image information stored in the frame memory 29 and is then supplied to the adder 25. In the adder 25, the reference image from the motion prediction/compensation section 28 is combined with the output from the inverse orthogonal transformation section 25 to generate image information. The other processing is carried out in the same manner as with a frame subjected to intra-encoding and will not be described.

According to H.26L, two types of encoding: UVLC (Universal Variable Length Code), one type of variable-length encoding, and CABAC (Context-based adaptive binary arithmetic coding), one type of arithmetic coding, are defined as lossless encoding schemes. Thus, the user can select one of UVLC and CABAC as a lossless encoding scheme. The information indicating whether the lossless encoding scheme used is UVLC or CABAC is specified in the field called Entropy Coding included in the RTP Parameter Set Packet of the RTP layer in the image compression information.

Arithmetic coding, to which CABAC belongs, will now be described. In arithmetic coding, any message (including a plurality of alphabetic symbols) is represented as one point in a semi-open interval $0.0 \leq x < 1.0$, and the code is generated based on the coordinates of this point.

First, the semi-open interval $0.0 \leq x < 1.0$ is divided into subintervals, each corresponding to a symbol, on the basis of the occurrence probabilities of the symbols included in the alphabetic sequence.

FIG. 3 shows an example of the occurrence probabilities of symbols $s_1$ to $s_7$ with their respective subintervals. In arithmetic coding, the upper limit and the lower limit of a subinterval are determined on the basis of the cumulative occurrence probability of each symbol, as shown in FIG. 3. The lower limit of the subinterval for the symbol $s_i$ ($i=1, 2, \ldots, 7$) is equal to the upper limit of the subinterval for the preceding symbol $s_{i-1}$, and the upper limit of the subinterval for the symbol $s_i$ is equal to the value obtained by adding the occurrence probability of the symbol $s_i$ to the lower limit of the subinterval for the symbol $s_i$.

Let us assume that $(s_2 s_1 s_3 s_6 s_7)$ is input as a message. Here, the symbol $s_7$ is assumed to be a terminal symbol which represents the end of the message. In short, the message ends with this terminal symbol. The arithmetic coding scheme calculates a subinterval corresponding to each symbol included in the message $(s_2 s_1 s_3 s_6 s_7)$, as shown in FIG. 4. In other words, the interval assigned as shown in FIG. 3 is divided in proportion to the cumulative occurrence probability of the subsequent symbol. The subinterval obtained finally is the range which includes the value representing the message. In this manner, any value in this range can uniquely restore the corresponding message. It is noted, however, that a value that can be represented by a power of two in the semi-open interval is used to represent the message, taking the encoding efficiency into consideration.

More specifically, in this example, the value obtained by Expression (2) shown below represents the message included in the semi-open interval $0.21164 \leq x < 0.2117$ on the basis of Expressions (1) shown below.

$$2^{-1} = 0.5$$

$$2^{-2} = 0.25$$

$$2^{-3} = 0.125$$

$$2^{-4} = 0.0625$$

$$2^{-5} = 0.03125$$

$$2^{-6} = 0.015625$$

$$2^{-7} = 0.0078125$$

$$2^{-8} = 0.00390625$$

$$2^{-9} = 0.001953125$$

$$2^{-10} = 0.0009765625$$

$$2^{-11} = 0.00048828125$$

$$2^{-12} = 0.000244140625$$

$$\ldots \tag{1}$$

$$2^{-3} + 2^{-4} + 2^{-6} + 2^{-7} + 2^{-11} + 2^{-12} = 0.211669921875 \tag{2}$$

Thus, a code length of 12 bits is sufficient for the length of the code corresponding to the message $(s_2 s_1 s_3 s_6 s_7)$ so that a value from $2^{-1}$ to $2^{-12}$ can be represented to encode the message $(s_2 s_1 s_3 s_6 s_7)$ into (001101100011).

CABAC defined in H.26L will now be described. Details of CABAC are described in a document "Video Compression Using Context-Based Adaptive Arithmetic Coding", Marpe et al, ICIO1 (hereinafter, referred to as Document 1). CABAC has the following three features, compared with UVLC, which is also defined in H.26L.

A first feature is a capability of eliminating the redundancy between symbols by using a context model appropriate for each symbol to be encoded to carry out arithmetic coding based on an independent probability model.

A second feature is a capability of assigning a bit rate of a non-integer value to each symbol in arithmetic coding, i.e., a capability of achieving an encoding efficiency similar to that of entropy.

For example, statistical data of a motion vector is variable in space and time, as well as with respect to bit rates and sequences. A third feature enables encoding in response to such variations to be carried out by applying adaptive encoding.

FIG. 5 shows a typical structure of a CABAC encoder to which CABAC is applied. In the relevant CABAC encoder, a context modeling section 31 first converts the symbol of any syntax element in image compression information to an appropriate context model according to the history. Such modeling is called context modeling. The context model for each syntax element in image compression information will be described below.

A binarization section 32 binarizes a symbol which is not binarized. In an adaptive binary arithmetic coding section 33, the binarized symbol is then subjected to probability estimation by a probability estimation section 34, and is subjected to adaptive arithmetic coding by an encoding engine 35 based on the probability estimation. After adaptive arithmetic coding processing has been carried out, the related models are updated, and each model can carry out encoding processing according to the statistics of actual image compression information.

Here, context models for carrying out arithmetic coding of MB_type (MB_type), motion vector information (MVD), and reference frame parameter (Ref_frame), which are syntax elements in image compression information, will now be described.

Context model generation for MB_type will be described for each of two cases: a case of intra-frame and a case of inter-frame.

If macroblocks A, B, and C are arranged as shown in FIG. 6 on an intra-frame, the context model ctx_mb_type_intra(C) corresponding to the MB_type of the macroblock C is defined according to Expression (3) shown below. The mode of a macroblock on an intra-frame is Intra4×4 or Intra16×1.

$$\text{ctx\_mb\_type\_intra}(C) = A + B \tag{3}$$

In Expression (3), A is 0 when the macroblock A is Intra4×4 or 1 when the macroblock A is Intra16×16. Similarly, B is 0 when the macroblock B is Intra4×4 or 1 when the macroblock B is Intra16×16. Therefore, the context model ctx_mb_type_intra(C) takes one of 0, 1, and 2.

If the macroblocks A, B, and C are arranged as shown in FIG. 6 on an inter-frame which is a P picture, the context model ctx_mb_type_inter(C) corresponding to the MB_type of the macroblock C is defined according to Expression (4) shown below. If the relevant inter-frame is a B picture, the context model ctx_mb_type_inter(C) is defined according to Expression (5) shown below.

$$\text{ctx\_mb\_type\_inter}(C) = ((A == \text{Skip})?0:1) + ((B == \text{Skip})?0:1) \tag{4}$$

$$\text{ctx\_mb\_type\_inter}(C) = ((A == \text{Direct})?0:1) + ((B == \text{Direct})?0:1) \tag{5}$$

In Expression (4), the operator ((A==Skip)?0:1) indicates 0 if the macroblock A is in the Skip mode or 1 if the macroblock A is not in the Skip mode. Similarly, the operator ((B==Skip)?0:1) indicates 0 if the macroblock B is in the Skip mode or 1 if the macroblock B is not in the Skip mode.

In Expression (5), the operator ((A==Direct)?0:1) indicates 0 if the macroblock A is in the Direct mode or 1 if the macroblock A is not in the Direct mode. Similarly, the operator ((B==Direct)?0:1) indicates 0 if the macroblock B is in the Direct mode or 1 if the macroblock B is not in the Direct mode.

Therefore, there are three types of the context model ctx_mb_type_inter(C) corresponding to the MB type of the macroblock C on an inter-frame (P picture) for each of the P picture and the B picture.

Context model generation for motion vector information (MVD) will now be described.

Motion vector information corresponding to the macroblock of interest included in image compression information is encoded as prediction errors from the motion vector corresponding to the neighboring macroblocks. The evaluation function $e_k(C)$ for the macroblock C of interest, from among the macroblocks A, B, and C arranged as shown in FIG. 7, is defined according to Expression (6) shown below. In Expression (6), k=0 indicates the horizontal component, whereas k=1 indicates the vertical component.

$$e_k(C)=|mvd_k(A)|+|mvd_k(B)| \quad (6)$$

Here, $mvd_k(A)$ and $mvd_k(B)$ indicate motion vector prediction errors with respect to the macroblocks A and B, respectively, neighboring the macroblock C.

In Expression (6), if the macroblock C is disposed at the left edge of the picture frame, i.e., if one of the macroblocks A and B does not exist, information related to the corresponding motion vector prediction error $mvd_k(A)$ or $mvd_k(B)$ cannot be obtained, and hence the corresponding item in the right-hand member of Expression (6) is ignored. The context model ctx_mvd(C,k) corresponding to $e_k(C)$ defined as described above is defined according to Expressions (7-1) to (7-3) below.

$$ctx\_mvd(C,k)=0 \; e_k(C)<3 \quad (7\text{-}1)$$

$$ctx\_mvd(C,k)=1 \; 32<e_k(C) \quad (7\text{-}2)$$

$$ctx\_mvd(C,k)=2 \; 3 \leq e_k(C) \leq 32 \quad (7\text{-}3)$$

Context model generation for the motion vector information (MVD) is carried out as shown in FIG. 8. More specifically, the motion vector prediction error $mvd_k(C)$ for the macroblock C is divided into the absolute value $|mvd_k(C)|$ and the sign. The absolute value $|mvd_k(C)|$ is binarized. The first bin (the leftmost value) of the binarized absolute value $|mvd_k(C)|$ is encoded using the above-described context model ctx_mvd(C,k). The second bin (the second value from the left) is encoded using context model 3. Similarly, the third and fourth bins are encoded using context models 4 and 5, respectively. The fifth bin and the subsequent bins are encoded using context model 6. The sign of $mvd_k(C)$ is encoded using context model 7. As described above, motion vector information (MVD) is encoded using eight types of context models.

Context models for encoding the reference frame parameter (Ref_frame) will now be described.

When two or more reference frames are used for an inter-frame, information related to the reference frame is set for each macroblock of the inter-frame. If the reference frame parameters for the macroblocks A and B are represented as A and B, respectively, with respect to the macroblocks A, B, and C arranged as shown in FIG. 6, the context model ctx_ref_frame(C) for the macroblock C is defined according to Expression (8) shown below.

$$ctx\_ref\_frame(C)=((A==0)?0:1)+2((B==0)?0:1) \quad (8)$$

In Expression (8), the operator ((A==0)?0:1) is 0 when the reference frame parameter for the macroblock A is 0 or 1 when the reference frame parameter for the macroblock A is not 0. Similarly, the operator ((B==0)?0:1) is 0 when the reference frame parameter for the macroblock B is 0 or 1 when the reference frame parameter for the macroblock B is not 0.

Thus, four types of context models for encoding the reference frame parameter (Ref_frame) are defined according to Expression (8). Furthermore, the context model for the second bin and the context models for the third bin and the subsequent bins are defined.

Context models for arithmetically encoding the code block pattern (CBP), which is a syntax element related to the texture information included in the image compression information according to H.26L, the intra-prediction mode (IPRED), and the (RUN,LEVEL) information will now be described.

The description starts with context models related to the code block pattern. The handling of code block patterns other than an Intra16×16 macroblock is defined as follows.

That is, as the CBP bits for the luminance signal, one CBP bit is included in each of four 8×8 blocks of an Intra16×16 macroblock, i.e., a total of four CBP bits. When the macroblocks A, B, and C are arranged as shown in FIG. 6, the context model ctx_cbp_luma(C) corresponding to the luminance signal of the macroblock C is defined according to Expression (9) shown below.

$$ctx\_cbp\_luma(C)=A+2B \quad (9)$$

In Expression (9), A indicates the CBP bit of the luminance signal of the macroblock A, and B indicates the CBP bit of the luminance signal of the macroblock B.

The remaining two bits in the CBP field are related to the chrominance signal. The context model ctx_cbp_chroma_sig (C) corresponding to the chrominance signal of the macroblock C is defined according to Expression (10) shown below.

$$ctx\_cbp\_chroma\_sig(C)=A+2B \quad (10)$$

In Expression (10), A indicates the CBP bit of the chrominance signal of the macroblock A, and B indicates the CBP bit of the chrominance signal of the macroblock B.

Here, if the context model ctx_cbp_chroma_sig(C) corresponding to the chrominance signal of the macroblock C is not 0, i.e., if the AC components of the chrominance signal exist, the context model ctx_cbp_chroma_ac(C) corresponding to the AC components of the chrominance signal of the macroblock C defined according to Expression (11) shown below needs to be encoded.

$$ctx\_cbp\_chroma\_ac(C)=A+2B \quad (11)$$

In Expression (11), A indicates the cbp_chroma_ac decision corresponding to the macroblock A, and B indicates the cbp_chroma_ac decision corresponding to the macroblock B.

Since the context models defined according to Expressions (9) to (11) are defined separately for the intra-macroblock and the inter-macroblock, a total of 24 (=2×3×4) types of context models are defined.

Furthermore, in the case of an Intra16×16 macroblock, one type of context model is defined for the binarized AC decision, and one type of context model is defined for each component of the chrominance signal.

Context models related to the intra-prediction mode (IPRED) will now be described. Six types of intra-prediction modes (label 0 to 5) defined in H.26L will now be described with reference to FIGS. 9 and 10. FIG. 9 shows pixels a to p existing in a 4×4 block generated by dividing a macroblock and pixels A to I existing in the neighboring 4×4 blocks. Labels 1 to 5 in FIG. 10 indicate intra-prediction modes with different directions. The intra-prediction mode indicated by label 0 is a DC prediction mode (DC Prediction).

In the intra-prediction mode of label 0, the pixels a to p are predicted according to Expression (12) shown below.

$$\text{pixels } a \text{ to } p = (A+B+C+D+E+F+G+H)//8 \quad (12)$$

In Expressions (12) to (15), A to I indicate the pixels A to I, respectively, and the symbol "//" means an arithmetic operation such that the result of division is rounded off.

In the intra-prediction mode indicated by label 0, if four pixels (e.g., the pixels A to D) of the eight pixels A to H do not exist in the picture frame, Expression (12) is not used and the mean value of the remaining four pixels (the pixels E to H in this case) is used as predicted values for the pixels a to p. Furthermore, if none of the eight pixels A to H exists in the picture frame, Expression (12) is not used and a predetermined value (e.g., 128) is used as predicted values of the pixels a to p.

The intra-prediction mode indicated by label 1 is called Vertical/Diagonal Prediction. The intra-prediction mode of label 1 is used only when the four pixels A to D exist in the picture frame. In this case, the pixels a to p are predicted according to Expressions (13-1) to (13-6) shown below.

$$\text{pixel } a = (A+B)//2 \quad (13\text{-}1)$$

$$\text{pixel } e = B \quad (13\text{-}2)$$

$$\text{pixels } b, i = (B+C)//2 \quad (13\text{-}3)$$

$$\text{pixels } f, m = C \quad (13\text{-}4)$$

$$\text{pixels } c, j = (C+D)//2 \quad (13\text{-}5)$$

$$\text{pixels } d, g, h, k, l, n, o, p = D \quad (13\text{-}6)$$

The intra-prediction mode indicated by label 2 is called Vertical Prediction. The intra-prediction mode of label 2 is used only when the four pixels A to D exist in the picture frame. In this case, the pixel A is used as predicted values of, for example, the pixels a, e, i, and m, and the pixel B is used as predicted values of, for example, the pixels b, f, j, and n.

The intra-prediction mode indicated by label 3 is called Diagonal Prediction. The intra-prediction mode of label 1 is used only when the nine pixels A to I exist in the picture frame. In this case, the pixels a to p are predicted according to Expressions (14-1) to (13-7) shown below.

$$\text{pixel } m = (H+2G+F)//4 \quad (14\text{-}1)$$

$$\text{pixels } i, n = (G+2F+E)//4 \quad (14\text{-}2)$$

$$\text{pixels } e, j, o = (F+2E+I)//4 \quad (14\text{-}3)$$

$$\text{pixels } a, f, k, p = (E+2I+A)//4 \quad (14\text{-}4)$$

$$\text{pixels } b, g, l = (I+2A+B)//4 \quad (14\text{-}5)$$

$$\text{pixels } c, h = (A+2B+C)//4 \quad (14\text{-}6)$$

$$\text{pixel } d = (B+2C+D)//4 \quad (14\text{-}7)$$

The intra-prediction mode indicated by label 4 is called Horizontal Prediction. The intra-prediction mode of label 4 is used only when the four pixels E to H exist in the picture frame. In this case, the pixel E is used as predicted values of, for example, the pixels a, b, c, and d, and the pixel F is used as predicted values of, for example, the pixels e, f, g, and h.

The intra-prediction mode indicated by label 5 is called Horizontal/Diagonal Prediction. The intra-prediction mode of label 5 is used only when the four pixels E to H exist in the picture frame. In this case, the pixels a to p are predicted according to Expressions (15-1) to (15-6) shown below.

$$\text{pixel } a = (E+F)//2 \quad (15\text{-}1)$$

$$\text{pixel } b = F \quad (15\text{-}2)$$

$$\text{pixels } c, e = (F+G)//2 \quad (15\text{-}3)$$

$$\text{pixels } f, d = G \quad (15\text{-}4)$$

$$\text{pixels } i, g = (G+H)//2 \quad (15\text{-}5)$$

$$\text{pixels } h, j, k, l, m, n, o, p = H \quad (15\text{-}6)$$

Two context models are defined for each of the intra-prediction modes of labels 0 to 5. More specifically, one of the two context models is the first bin for each mode and the other of the two context models is the second bin for each mode. In addition to these context models, one context model is defined for each of the two bits in the Intra16×16 mode. Therefore, a total of 14 context models are defined for the intra-prediction mode.

Context models related to (RUN,LEVEL) will now be described.

In H.26L, two types of scan methods shown in FIGS. 11A and 11B are defined as methods for rearranging a two-dimensional discrete cosine transform coefficient into a one-dimensional coefficient. The single scan technique shown in FIG. 11A is used for the luminance signal of an intra-macroblock in a case other than that where the quantization parameter QP is smaller than 24. The double scan technique shown in FIG. 11B is used when the single scan technique is not used.

In an inter-macroblock and an intra-macroblock with a quantization parameter QP of 24 or larger, an average of one non-zero coefficient exists for a 4×4 macroblock, in short, a one-bit EOB (End Of Block) signal is sufficient. For the luminance signal of an intra-macroblock with a quantization parameter QP smaller than 24, two or more non-zero coefficients exist, and a one-bit EOB signal is not sufficient. This is the reason that the double scan technique shown in FIG. 11B is used.

As shown in FIG. 12, nine types of context models are defined for (RUN,LEVEL) according to the discrimination of the above-described scan method, the discrimination between DC block type and AC block type, the discrimination between luminance signal and chrominance signal, and the discrimination between intra-macroblock and inter-macroblock.

The LEVEL information is separated into the sign and the absolute value. Four context models are defined according to the corresponding Ctx_run_level shown in FIG. 12. More specifically, the first context model is defined for the sign, the second context model is defined for the first bin, the second context model is defined for the second bin, and the fourth context model is defined for the subsequent bins.

When LEVEL is not 0 (i.e., the LEVEL is not an EOB), RUN described below is encoded. For RUN, two context models are defined for each Ctx_run_level shown in FIG. 12: one for the first bin and the other for the second and subsequent bins.

Context models for the quantization-related parameter Dquant that can be set at the macroblock level in image compression information according to H.26L will now be described.

The parameter Dquant is set when the code block pattern for the macroblock includes a non-zero orthogonal transform coefficient or the macroblock is 16×16 Intra Coded. The parameter Dquant can range from −16 to 16. The quantization parameter $QUANT_{new}$ for the macroblock is calculated according to Expression (16) shown below that uses the parameter Dquant in the image compression information.

$$QUANT_{new} = \text{modulo}_{32}(QUANT_{old} + D\text{quant} + 32) \quad (16)$$

In Expression (16), $QUANT_{old}$ is the quantization parameter used for the previous encoding or decoding.

The first context model ctx_dquant(C) for the parameter Dquant of the macroblock C arranged as shown in FIG. 6 is defined according to Expression (17) shown below.

$$\text{ctx\_dquant}(C) = (A \mathrel{!}= 0) \quad (17)$$

In Expression (17), A indicates the value of the parameter Dquant of the macroblock A. The second context model is defined for the first bin and the second context model is defined for the second and the subsequent bins.

If a symbol which is input to the context models described above is not binarized, the symbol must be binarized before it can be input to the context models. Syntax elements other than MB_type are binarized according to the relationships shown in FIG. 13.

MB_type, ten types of which are defined for the P picture, is binarized according to the relationship shown in FIG. 14A. Furthermore, MB_type, 17 types of which are defined for the B picture, is binarized according to the relationships shown in FIG. 14B.

Registers for the above-described various context models are pre-initialized with pre-calculated values, and when a symbol is to be encoded, the occurrence frequencies of the bins for a series of context models are successively updated for a determination in the encoding of the subsequent symbol.

If the occurrence frequency for a given context model exceeds a predetermined value, the frequency counter is scaled down. Through such periodic scaling processing, dynamic occurrence of symbols can be handled easily.

For the arithmetic coding scheme for binarized symbols in H.26L, the approach disclosed in a document "Arithmetic Coding for Data Compression", (Witten et al. Comm. of the ACM, 30 (6), 1987, pp 520-541) (hereinafter, referred to as Document 2) is applied, as of this writing.

In MPEG2, if an image signal to be input is of interlaced scan format, field/frame adaptive encoding processing can be carried out at the macroblock level.

Although such specifications are not defined in H.26L at present, a document "Interlace Coding Tools for H.26L Video Coding (L. Wang et al., VCEG-O37, December 2001)" (hereinafter, referred to as Document 3) proposes that the H.26L specifications be extended to support field/frame adaptive encoding processing at the macroblock level.

The field/frame adaptive encoding processing at the macroblock level proposed in Document 3 will now be described.

According to the current H.26L, seven types of modes (modes 1 to 7), as shown in FIG. 15, are defined as units of motion prediction/compensation in a macroblock.

Document 3 proposes that a frame/field flag be disposed between Run and MB_type as the syntax corresponding to the macroblock in image compression information, as shown in FIG. 16. If the value of the frame/field flag is 0, it indicates that the relevant macroblock is to be subjected to frame-based encoding. In contrast, if the value of the frame/field flag is 1, it indicates that the relevant macroblock is to be subjected to field-based encoding.

If the value of the frame/field flag is 1, i.e., if field-based encoding is to be applied, the pixels in the macroblock are rearranged row by row, as shown in FIG. 17.

If the value of the frame/field flag is 1, five types of modes (modes 1a to 5a), as shown in FIG. 18, i.e., the five types of modes corresponding to the modes 3 to 7 in FIG. 15, are defined as units of motion prediction/compensation in the macroblock.

For example, in the mode 2a of FIG. 18, the blocks 0 and 1 out of the four 8×8 blocks 0 to 3 generated by dividing the macroblock belong to the same field parity, and the blocks 2 and 3 belong to the same field parity. Furthermore, for example, in the mode 3a of FIG. 18, the blocks 0 to 3 of the eight 4×8 blocks 0 to 8 generated by dividing the macroblock belong to the same field parity, and the blocks 4 to 7 belong to the same field parity.

The intra-prediction mode when the value of the frame/field flag is 1 will now be described. For example, the pixels a to p disposed in the 4×4 block shown in FIG. 9 are subjected to intra-prediction using the pixels A to I disposed in the neighboring 4×4 blocks, also when the value of the frame/field flag is 1. In this case, it should be noted that all of the pixels a to p and the pixels A to I belong to the same field parity.

A description when the pixels A to I and the pixels a to p belong to the same macroblock will now be given with reference to FIG. 19. The pixels a to p existing in the 4×4 block 7 generated by dividing the macroblock into 16 are subjected to intra-prediction using the pixels A to I disposed at the edges of the neighboring blocks 2, 3, and 6.

A description when the pixels A to I belong to a macroblock different from that of the pixels a to p will now be given with reference to FIGS. 20A and 20B.

FIG. 20A shows that the frame/field flag values of the macroblocks to the left of and above the macroblock for processing are 1. In this case, the intra-prediction of the pixels existing in the 4×4 block C generated by dividing the target macroblock into 16 is carried out based on the pixels in the 4×4 block A generated by dividing the macroblock to the left into 16 and the pixels in the 4×4 block B generated by dividing the macroblock above into 16. The intra-prediction of the pixels existing in the 4×4 block C' is carried out based on the pixels existing in the 4×4 block A' and the pixels existing in the 4×4 block B'.

FIG. 20B shows an example where the value of the frame/field flag for the target macroblock for processing is 1 and the values of the frame/field flags for the macroblocks to the left and above are 0. In this case, the intra-prediction of the pixels existing in the 4×4 block C generated by dividing the target macroblock into 16 is carried out based on the pixels in the 4×4 block A generated by dividing the macroblock to the left into 16 and the pixels in the 4×4 block B generated by dividing the macroblock above into 16. The intra-prediction of the pixels existing in the 4×4 block C' is carried out based on the pixels existing in the 4×4 block A' and the pixels existing in the 4×4 block B'.

Intra-prediction of the chrominance signal will now be described with reference to FIG. 21. When the value of the frame/field flag is 1, only one type of intra-prediction mode for the chrominance signal is defined.

A to D in FIG. 21 each represent a 4×4 block of the chrominance signal. The blocks A and B belong to the first field and the blocks C and D belong to the second field. $s_0$ to $s_2$ are the sum of the chrominance signals existing in the blocks which belong to the first field parity and neighbor the blocks A to D. $s_3$ to $s_5$ are the sum of the chrominance signals existing in the blocks which belong to the second field parity and neighbor the blocks A to D.

The predicted values A to D respectively corresponding to the blocks A to D are predicted according to Expressions (18) shown below provided that $s_0$ to $s_5$ all exist in the picture frame.

$$A=(s_0+s_2+4)/8$$

$$B=(s_1+2)/4$$

$$C=(s_3+s_5+4)/8$$

$$D=(s_4+2)/4 \tag{18}$$

If only $s_0$, $s_1$, $s_3$, and $s_4$ of $s_0$ to $s_5$ exist in the picture frame, the predicted values A to D respectively corresponding to the blocks A to D are predicted according to Expressions (19) shown below.

$$A=(s_0+2)/4$$

$$B=(s_1+2)/4$$

$$C=(s_3+2)/4$$

$$D=(s_4+2)/4 \tag{19}$$

Furthermore, if only $s_2$ and $s_5$ of $s_0$ to $s_5$ exist in the picture frame, the predicted values corresponding to the blocks A to D are predicted according to Expressions (20) shown below.

$$A=(s_2+2)/4$$

$$B=(s_2+2)/4$$

$$C=(s_5+2)/4$$

$$D=(s_5+2)/4 \tag{20}$$

FIG. 22 shows a method for encoding the residual components of the chrominance signal after intra-prediction has been applied as described above. More specifically, each of the 4×4 blocks is subjected to orthogonal transformation processing, the 2×2 blocks as shown in the figure are generated using the DC components of the first field and the second field, and orthogonal transformation processing is again applied.

Motion prediction/compensation processing when the value of the frame/field flag is 1 will now be described. When the value of the frame/field flag is 1, there are six types of motion prediction/compensation modes: an inter-16×16 mode, an inter-8×16 mode, an inter-8×8 mode, an inter-4×8 mode, and an inter-4×4 mode.

For example, the inter-16×16 mode is a mode in which the motion vector information for the first field, the motion vector information for the second field, and the reference frame in the inter-8×16 mode are equivalent.

These six types of motion prediction/compensation modes are respectively assigned Code_Numbers 0 to 5.

In the current H.26L, a multiple-frame prediction for allowing a plurality of reference frames as shown in FIG. 23 to be provided is specified. In the current frame-based H.26L standard, information related to reference frames is defined at the macroblock level such that the previously encoded frame is assigned Code_Number 0, and the frames one to five times preceding the frame with Code_Number 0 are respectively assigned Code_Number 1 to Code_Number 5.

On the other hand, for field-based encoding, the first field of the previously encoded frame is assigned Code_Number 0, and the second field of the same frame is assigned Code_Number 1. The first field of the frame preceding the frame with Code_Number 0 is assigned Code_Number 2 and the second field of the relevant frame is assigned Code_Number 3. The first field of the frame preceding the frame with Code_Number 2 is assigned Code_Number 4 and the second field of the relevant frame is assigned Code_Number 5.

Furthermore, for macroblocks that are subjected to field-based encoding, the reference field for the first field and the reference field for the second field are specified separately from each other.

The median prediction specified in the current H.26L will now be described with reference to FIG. 24, followed by the description of a motion vector information prediction method when the value of the frame/field flag is 1. The 16×16, 8×8, or 4×4 motion vector information corresponding to the 16×16 macroblock E shown in FIG. 24 is predicted using the median of the motion vector information of the neighboring macroblocks A to C.

Any of the macroblocks A to C that does not exist in the picture frame, however, is assumed to have a motion vector information value of 0 for median calculation. If, for example, the macroblocks D, B, and C do not exist in the picture frame, the motion vector information corresponding to the macroblock A is used as the predicted value. Furthermore, if the macroblock C does not exist in the picture frame, the median is calculated using the motion vector information of the macroblock D instead of the macroblock C.

The reference frames for the macroblocks A to D do not need to be the same.

A description when the block size of the macroblock is 8×16, 16×8, 8×4, or 4×8 will now be given with reference to FIGS. 25A to 25D. The macroblock E of interest and the neighboring macroblocks A to D are assumed to be arranged as shown in FIG. 24.

FIG. 25A shows an example where the block sizes of the macroblocks E1 and E2 are 8×16. For the left-hand macroblock E1, if the neighboring macroblock A to the left refers to the same frame as the macroblock E1, the motion vector information of the macroblock A is used as the predicted value. If the neighboring macroblock A to the left refers to a frame different from that referred to by the macroblock E1, the above-described median prediction is applied.

For the right-hand macroblock E2, if the neighboring macroblock C to the upper right refers to the same frame as the macroblock E2, the motion vector information of the macroblock C is used as the predicted value. If the neighboring macroblock C to the upper right refers to a frame different from that referred to by the macroblock E2, the above-described median prediction is applied.

FIG. 25B shows an example where the block sizes of the macroblocks E1 and E2 are 16×8. For the upper macroblock E1, if the neighboring macroblock B above refers to the same frame as the macroblock E1, the motion vector information of the macroblock B is used as the predicted value. If the neighboring macroblock B above refers to a frame different from that referred to by the macroblock E1, the above-described median prediction is applied.

For the lower macroblock E2, if the neighboring macroblock A to the left refers to the same frame as the macroblock E2, the motion vector information of the macroblock A is used as the predicted value. If the neighboring macroblock A to the left refers to a frame different from that referred to by the macroblock E2, the above-described median prediction is applied.

FIG. 25C shows an example where the block sizes of the macroblocks E1 to E8 are 8×4. The above-described median prediction is applied for the left-hand macroblocks E1 to E4, and the motion vector information of the left-hand macroblocks E1 to E4 is used as the predicted values for the right-hand macroblocks E5 to E8.

FIG. 25D shows an example where the block sizes of the macroblocks E1 to E8 are 4×8. The above-described median prediction is applied for the upper macroblocks E1 to E4, and the motion vector information of the upper macroblocks E1 to E4 is used as the predicted values for the lower macroblocks E5 to E8.

Also, if the value of the frame/field flag is 1, the horizontal direction component of the motion vector information is predicted in compliance with the above-described method. For the vertical direction component, however, a field-based block and a frame-based block are mixed, and the following processing is carried out. The macroblock E of interest and the neighboring macroblocks A to D are assumed to be arranged as shown in FIG. 24.

When the macroblock E is to be subjected to frame-based encoding provided that one of the neighboring macroblocks A to D has been subjected to field-based encoding, the mean value between the vertical direction component of the motion vector information for the first field and the vertical direction component of the motion vector information for the second field is multiplied by two, and the result is used as an equivalent to the frame-based motion vector information for prediction processing.

When the macroblock E is to be subjected to field-based encoding provided that one of the neighboring macroblocks A to D has been subjected to frame-based encoding, the vertical direction component value of the motion vector information is divided by two, and the result is used as an equivalent to the field-based motion vector information for prediction processing.

According to Document 3, a syntax element necessary for field/frame encoding at the macroblock level is added, and furthermore, the semantics of a syntax element such as motion vector information is changed. Nevertheless, in Document 3, no new context model is introduced or an existing context model is not updated in response to the above-described addition and change. Thus, the information provided in Document 3 is not sufficient to carry out field/frame encoding at the macroblock level using the CABAC scheme.

CABAC is known as a scheme which achieves a higher encoding efficiency, though it requires a larger amount of arithmetic operation for encoding processing compared with UVLC, and therefore it is preferable that CABAC is available for field/frame encoding at the macroblock level even when input image information has an interlaced scan format.

DISCLOSURE OF INVENTION

In view of the situation described above, an object of the present invention is to enable field/frame encoding at the macroblock level to be performed using the CABAC scheme even when input image information has an interlaced scan format.

An encoding apparatus according to the present invention includes lossless encoding means for carrying out lossless encoding processing using a context model corresponding to a frame/field flag indicating whether the encoding processing at the macroblock level is field-based or frame-based, a context model corresponding to a syntax element for carrying out the frame-based encoding processing, and a context model corresponding to a syntax element for carrying out the field-based encoding processing.

The context model corresponding to the syntax element for carrying out the field-based encoding processing may include at least one of the context models corresponding to an MB_type for an I picture, an MB_type for a P/B picture, motion vector information, a reference field parameter, and an intra-prediction mode.

An encoding method according to the present invention includes a lossless encoding step of carrying out lossless encoding processing using a context model corresponding to a frame/field flag indicating whether the encoding processing at the macroblock level is field-based or frame-based, a context model corresponding to a syntax element for carrying out the frame-based encoding processing, and a context model corresponding to a syntax element for carrying out the field-based encoding processing.

A program on a first recording medium according to the present invention includes a lossless encoding step of carrying out lossless encoding processing using a context model corresponding to a frame/field flag indicating whether the encoding processing at the macroblock level is field-based or frame-based, a context model corresponding to a syntax element for carrying out the frame-based encoding processing, and a context model corresponding to a syntax element for carrying out the field-based encoding processing.

A first program according to the present invention enables a computer to execute a lossless encoding step of carrying out lossless encoding processing using a context model corresponding to a frame/field flag indicating whether the encoding processing at the macroblock level is field-based or frame-based, a context model corresponding to a syntax element for carrying out the frame-based encoding processing, and a context model corresponding to a syntax element for carrying out the field-based encoding processing.

A decoding apparatus according to the present invention includes decoding means for decoding image compression information that is encoded using a context model corresponding to a frame/field flag indicating whether the encoding processing at the macroblock level is field-based or frame-based, a context model corresponding to a syntax element for carrying out the frame-based encoding processing, and a context model corresponding to a syntax element for carrying out the field-based encoding processing.

A decoding method according to the present invention includes a decoding step of decoding image compression information that is encoded using a context model corresponding to a frame/field flag indicating whether the encoding processing at the macroblock level is field-based or frame-based, a context model corresponding to a syntax element for carrying out the frame-based encoding processing, and a context model corresponding to a syntax element for carrying out the field-based encoding processing.

A program on a second recording medium according to the present invention includes a decoding step of decoding image compression information that is encoded using a context model corresponding to a frame/field flag indicating whether the encoding processing at the macroblock level is field-based or frame-based, a context model corresponding to a syntax element for carrying out the frame-based encoding processing, and a context model corresponding to a syntax element for carrying out the field-based encoding processing.

A second program according to the present invention enables a computer to execute a decoding step of decoding image compression information that is encoded using a context model corresponding to a frame/field flag indicating whether the encoding processing at the macroblock level is field-based or frame-based, a context model corresponding to a syntax element for carrying out the frame-based encoding processing, and a context model corresponding to a syntax element for carrying out the field-based encoding processing.

In the encoding apparatus, encoding method, and first program according to the present invention, lossless encoding is carried out using a context model corresponding to a frame/field flag indicating whether the encoding processing at the macroblock level is field-based or frame-based, a context model corresponding to a syntax element for carrying out the frame-based encoding processing, and a context model corresponding to a syntax element for carrying out the field-based encoding processing.

In the decoding apparatus, decoding method, and second program according to the present invention, image compression information that is encoded using a context model corresponding to a frame/field flag indicating whether the encoding processing at the macroblock level is field-based or frame-based, a context model corresponding to a syntax element for carrying out the frame-based encoding processing, and a context model corresponding to a syntax element for carrying out the field-based encoding processing is decoded.

The encoding apparatus and the decoding apparatus may be apparatuses independent of each other or may be a block for carrying out encoding and decoding in a signal processing apparatus.

17

BRIEF DESCRIPTION OF THE DRAWINGS

FIG. 3 is a diagram showing an example of the relationship between the occurrence probabilities of symbols and their respective subintervals in arithmetic coding.

FIG. 12 is a diagram showing a context model corresponding to (RUN,LEVEL) defined in H.26L.

FIG. 13 is a diagram illustrating the binarization of syntax elements other than MB_type in H.26L.

FIG. 14A is a diagram illustrating the binarization of MB_type of the P picture in H.26L.

FIG. 14B is a diagram illustrating the binarization of MB_type of the B picture in H.26L.

Figure 15:
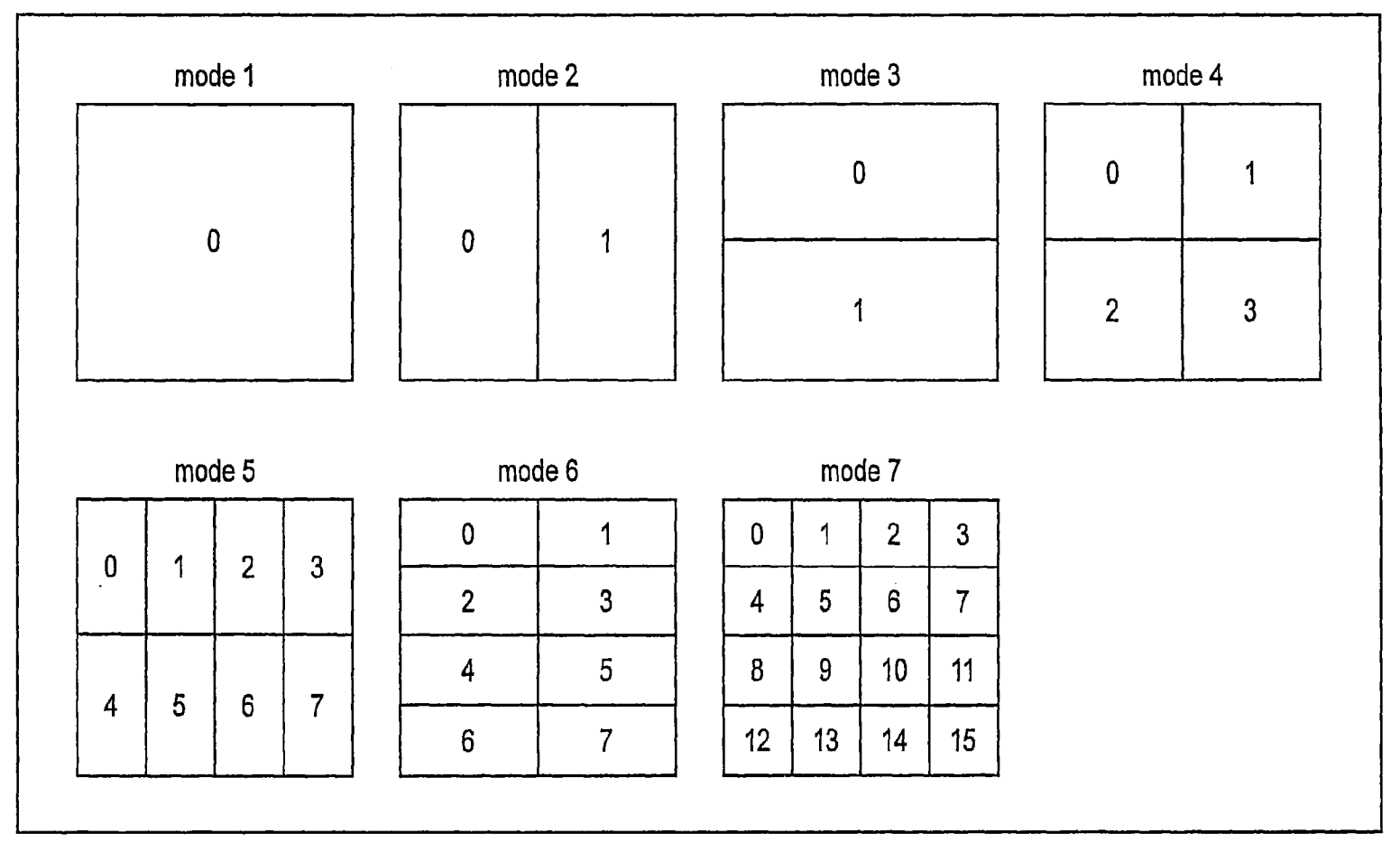

FIG. 15 is a diagram showing seven types of modes defined in H.26L as a unit of motion prediction/compensation in a macroblock.

18

Figure 24:
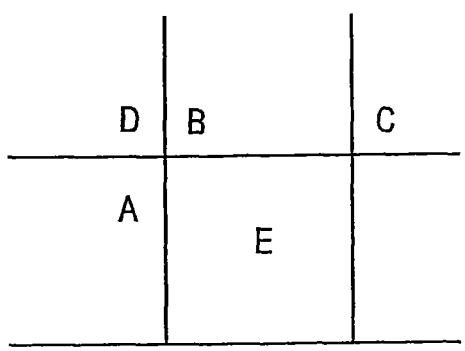

FIG. 24 is a diagram illustrating a method for predicting motion vector information when a macroblock is subjected to field-based encoding.

FIG. 25A is a diagram illustrating the generation of predicted values of motion vector information in prediction modes specified in H.26L.

FIG. 25B is a diagram illustrating the generation of predicted values of motion vector information in prediction modes specified in H.26L.

FIG. 25C is a diagram illustrating the generation of predicted values of motion vector information in prediction modes specified in H.26L.

FIG. 25D is a diagram illustrating the generation of predicted values of motion vector information in prediction modes specified in H.26L.

Figure 26:
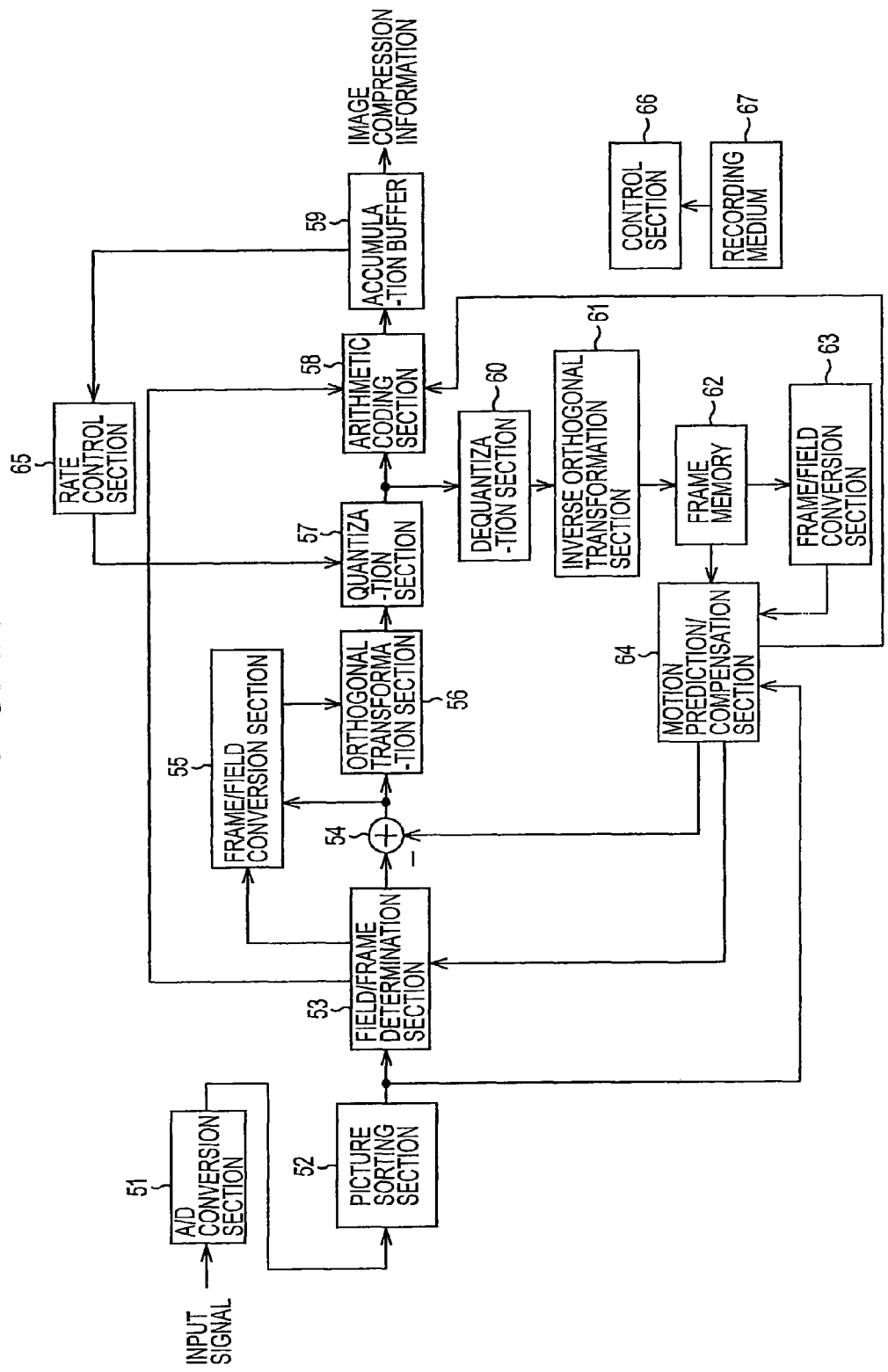

FIG. 26 is a block diagram showing an example structure of an image information encoding apparatus according to an embodiment of the present invention.

Figure 27:
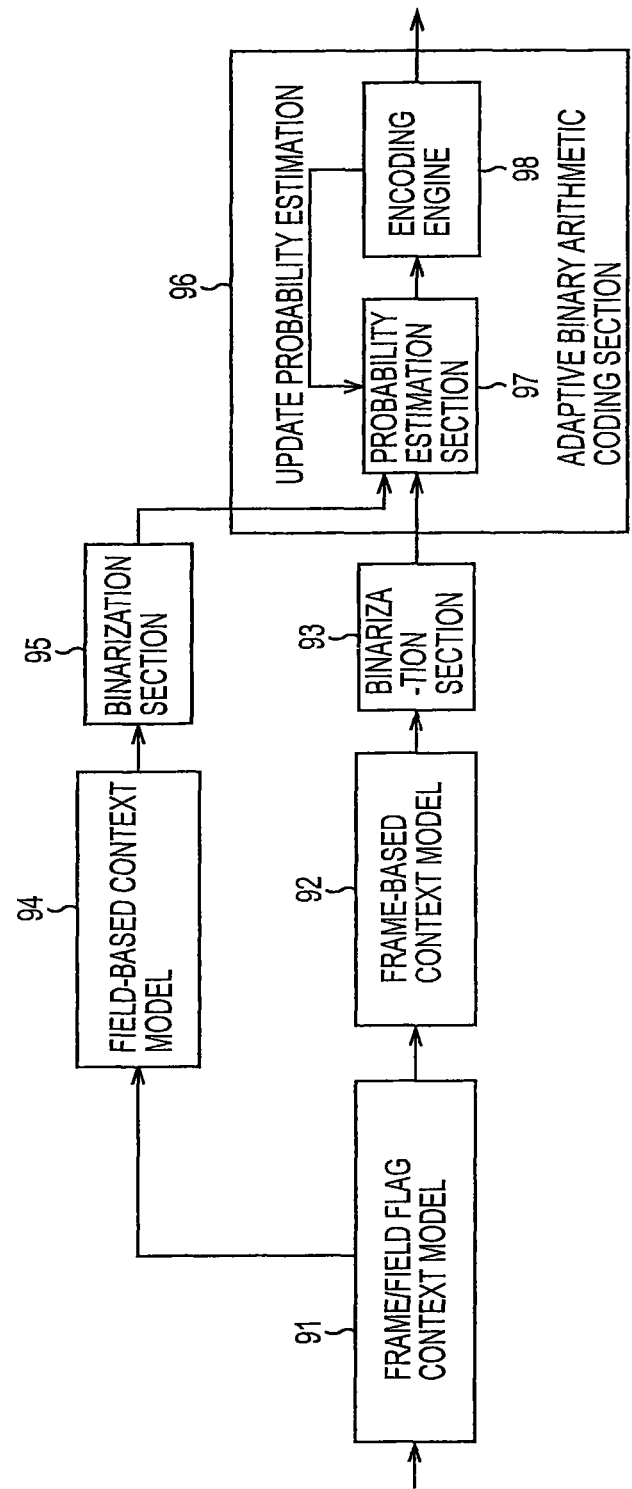

FIG. 27 is a block diagram showing an example structure of the arithmetic coding section 58 in FIG. 26.

FIG. 28A is a diagram showing a table for binarizing the MB_type of a macroblock belonging to a P picture when the macroblock is subjected to field-based encoding.

FIG. 28B is a diagram showing a table for binarizing the MB_type of a macroblock belonging to a B picture when the macroblock is subjected to field-based encoding.

Figure 29:
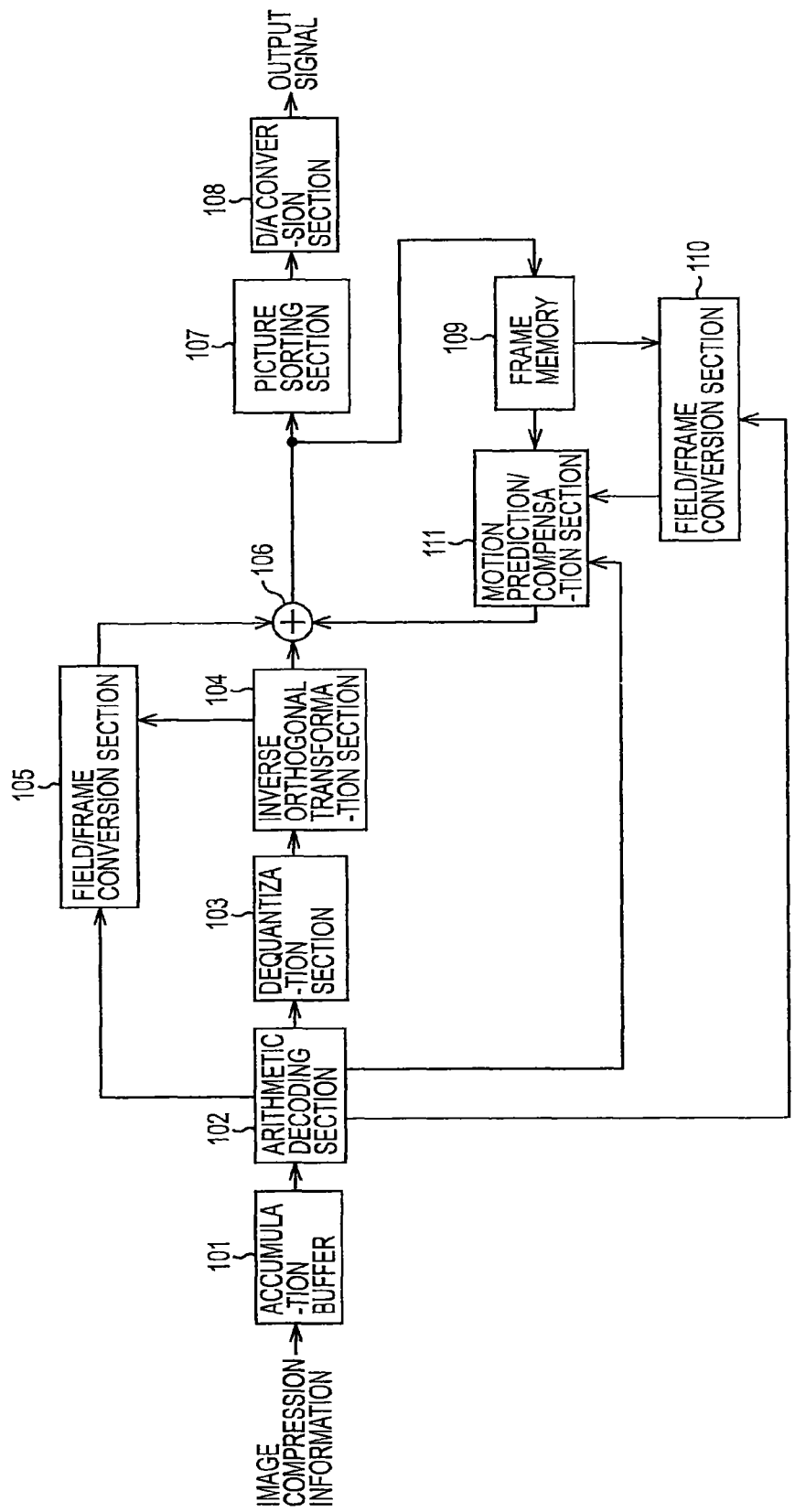

FIG. 29 is a block diagram showing an example structure of an image information decoding apparatus according to an embodiment of the present invention, the decoding apparatus corresponding to the image information encoding apparatus in FIG. 26.

BEST MODE FOR CARRYING OUT THE INVENTION

An image information encoding apparatus to which the present invention is applied will now be described with reference to FIG. 26. The relevant image information encoding apparatus enables encoding to be performed using the CABAC scheme even when input image information has an interlaced scan format.

In the relevant image information encoding apparatus, an A/D conversion section 51 converts an input image signal as an analog signal to a digital signal and outputs it to a picture sorting buffer 52. The picture sorting buffer 52 rearranges the input image information from the A/D conversion section 51 according to the GOP structure of the image compression information which is output from the relevant image information encoding apparatus and outputs it to an adder 54.

A field/frame determination section 53 determines which of frame-based encoding and field-based encoding provides a higher encoding efficiency to encode the macroblock of the image to be processed, generates the appropriate frame/field flag, and outputs the result to a field/frame conversion section 55 and an arithmetic coding section 58.

When the macroblock to be processed is subjected to inter-encoding, the adder 54 generates a differential image between the input image via the field/frame determination section 53 and the reference image from a motion prediction/compensation section 64, and outputs the differential image to the field/frame conversion section 55 and to an orthogonal transformation section 56. On the other hand, when the macroblock to be processed is subjected to intra-encoding, the adder 54 outputs the input image via the field/frame determination section 53 as-is to the field/frame conversion section 55 and to the orthogonal transformation section 56.

When the macroblock to be processed is subjected to field-based encoding, the field/frame conversion section 55 converts the input image from the adder 54 into a field structure, and outputs the result to the orthogonal transformation section 56. The orthogonal transformation section 56 applies orthogonal transformation (e.g., discrete cosine transformation or Karhunen-Loeve transform) to the input image information, and supplies the obtained transform coefficient to a quantization section 57. The quantization section 57 applies quantization processing to the transform coefficient supplied from the orthogonal transformation section 56 under the control of the rate control section 65.

The arithmetic coding section 58 arithmetically encodes each syntax element input from the quantization section 57 and the motion prediction/compensation section 64, as well as the frame/field flag from the field/frame determination section 53, based on the CABAC scheme, and supplies the results to an accumulation buffer 59 for accumulation. The accumulation buffer 59 outputs the accumulated image compression information to the subsequent stage.

A dequantization section 60 dequantizes the quantized orthogonal transform coefficient and outputs it to an inverse orthogonal transformation section 61. The inverse orthogonal transformation section 61 applies inverse orthogonal transformation processing to the dequantized transform coefficient, generates decoded image information, and supplies it to a frame memory 62 for accumulation. When the macroblock to be processed is subjected to field-based encoding, a field/frame conversion section 63 converts the decoded image information accumulated in the frame memory 62 into a field structure, and outputs it to the motion prediction/compensation section 64.

The motion prediction/compensation section 64 generates the optimal prediction mode information and the motion vector information through motion prediction processing and outputs it to the arithmetic coding section 58. Furthermore, the motion prediction/compensation section 64 generates a predicted image to output it to the adder 54. A rate control section 65 performs feedback control of the operation of the quantization section 57 based on the amount of data accumulated in the accumulation buffer 59. A control section 66 controls each section of the relevant image information encoding apparatus according to a control program recorded on a recording medium 67.

Figure 16:
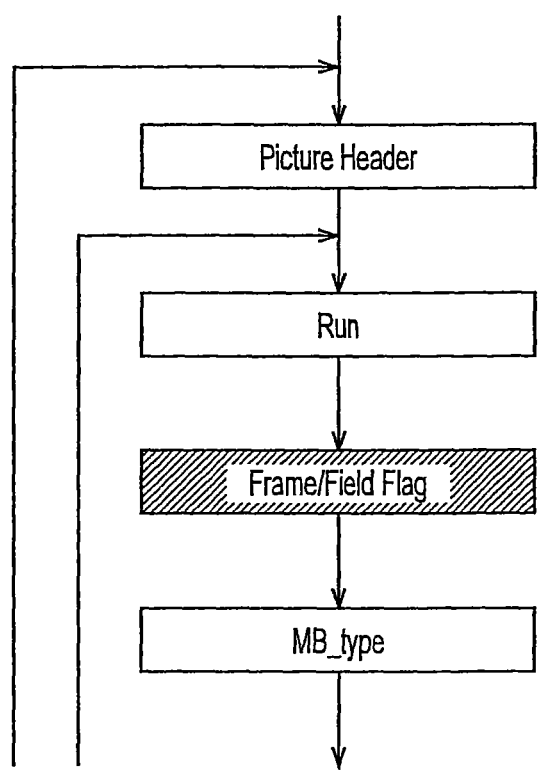
FIG. 16 is a diagram showing syntax for image compression information extended such that field/frame adaptive encoding can be carried out at the macroblock level.
Figure 17:
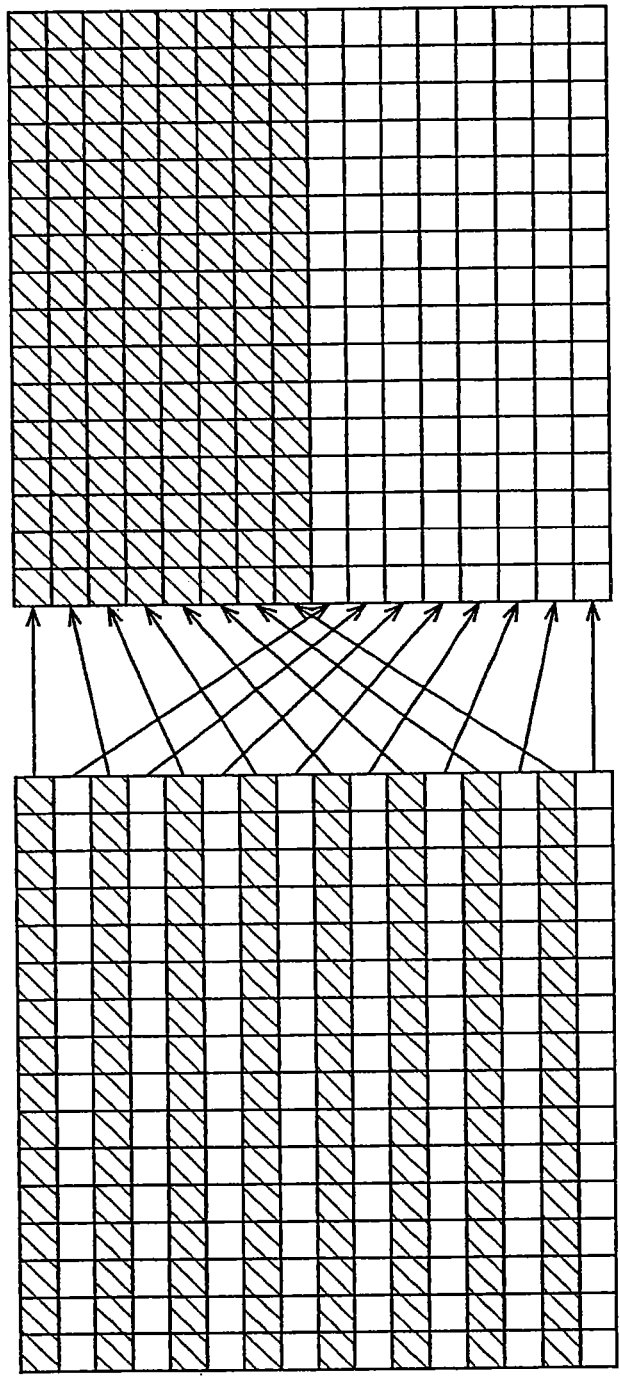
FIG. 17 is a diagram illustrating the rearrangement of pixels of a macroblock when the macroblock is subjected to field-based encoding.
Figure 18:
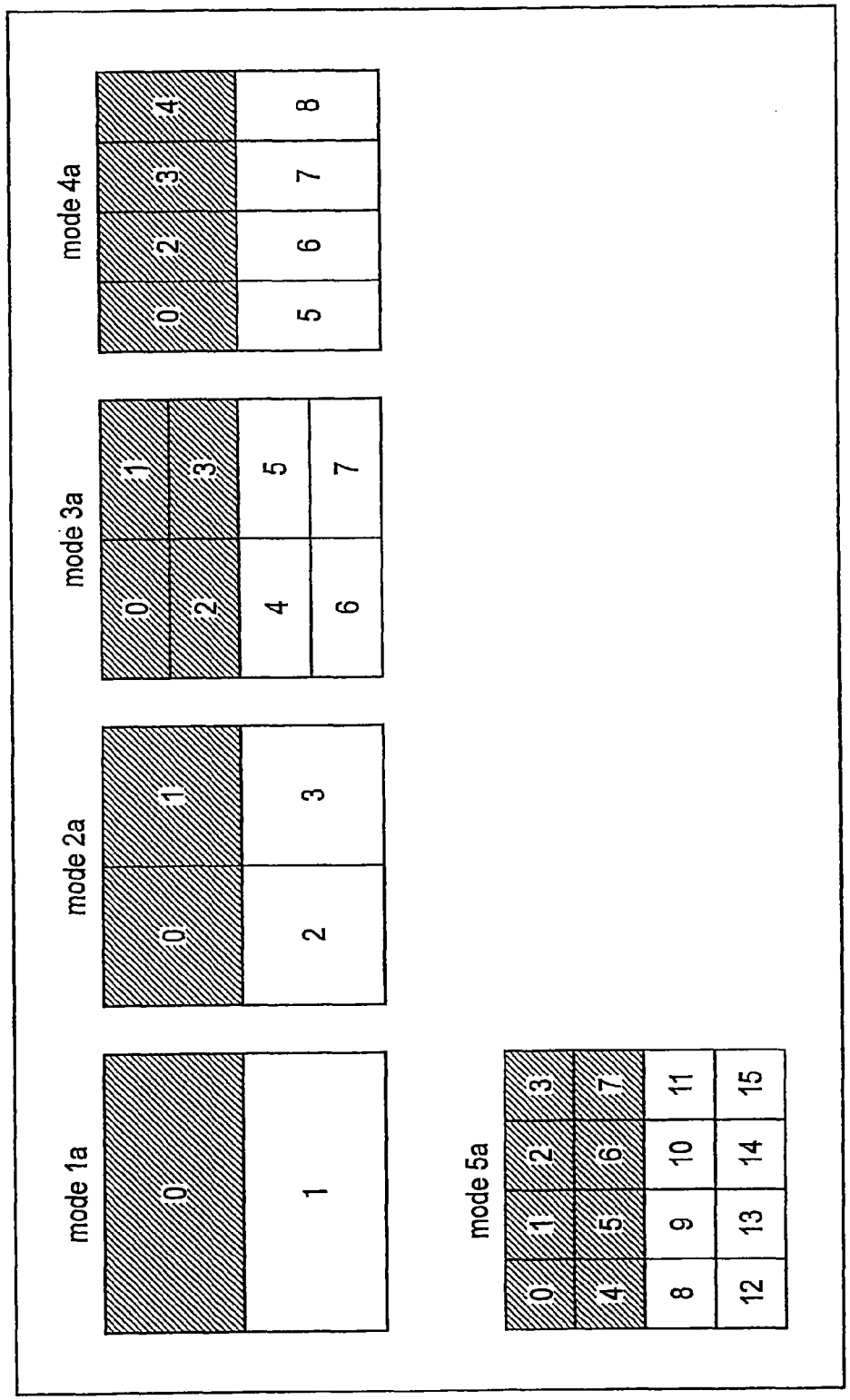
FIG. 18 is a diagram showing five types of modes defined as a unit of motion prediction/compensation when a macroblock is subjected to field-based encoding.
Figure 19:
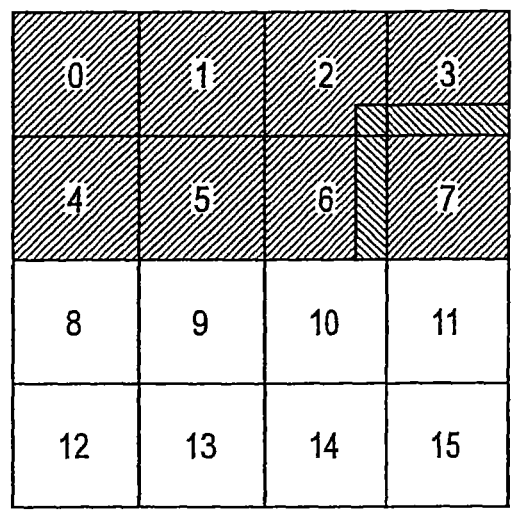
FIG. 19 is a diagram illustrating the operating principle for intra-prediction in a macroblock when the macroblock is subjected to field-based encoding.
Figure 20B:
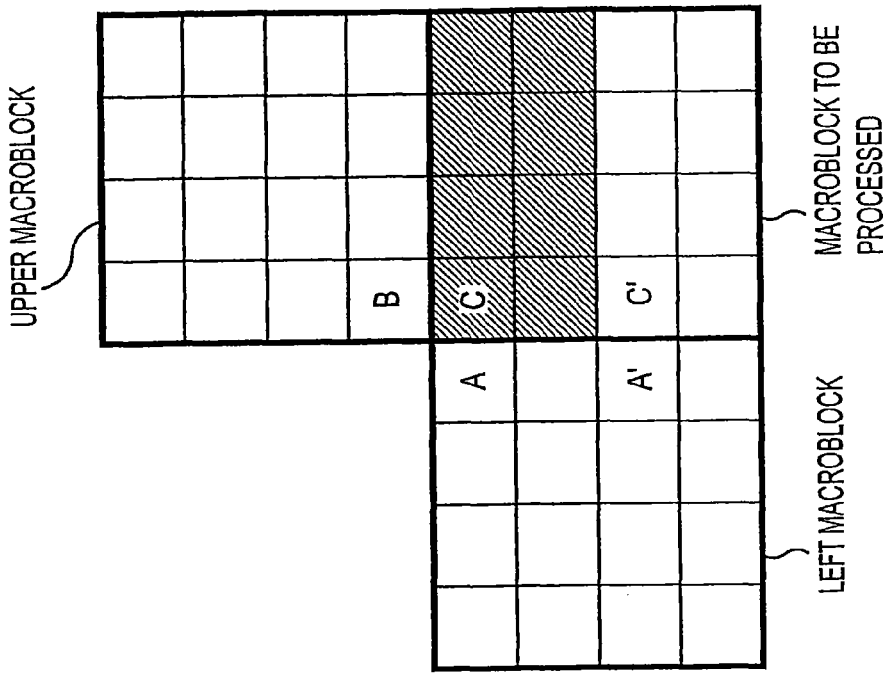
FIG. 20B is a diagram illustrating the operating principle for intra-prediction across macroblocks when a macroblock is subjected to field-based encoding.
Figure 20A:
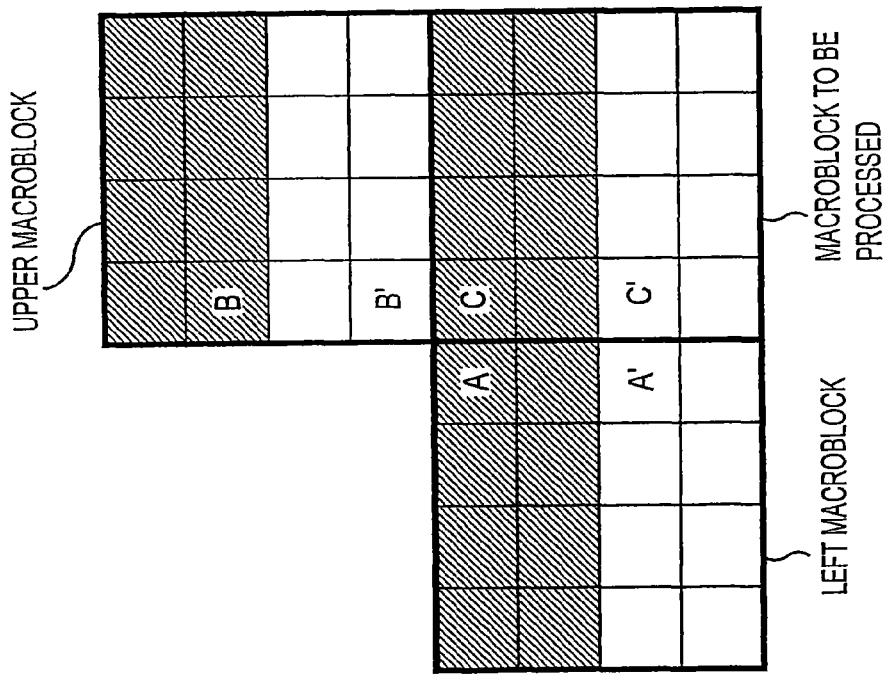
FIG. 20A is a diagram illustrating the operating principle for intra-prediction across macroblocks when a macroblock is subjected to field-based encoding.
Figure 21:
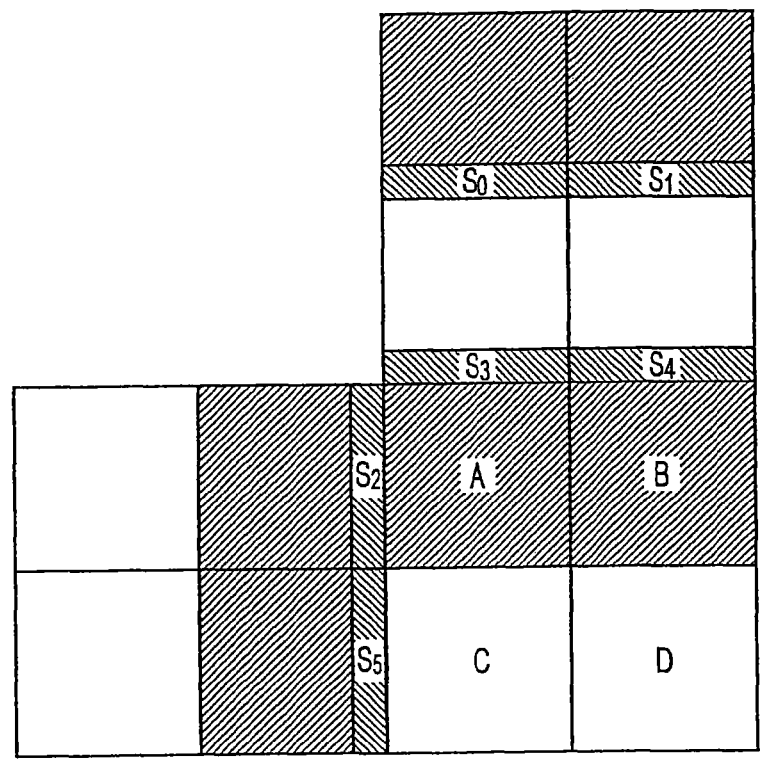
FIG. 21 is a diagram illustrating the operating principle for intra-prediction for the chrominance signal when a macroblock is subjected to field-based encoding.
Figure 22:
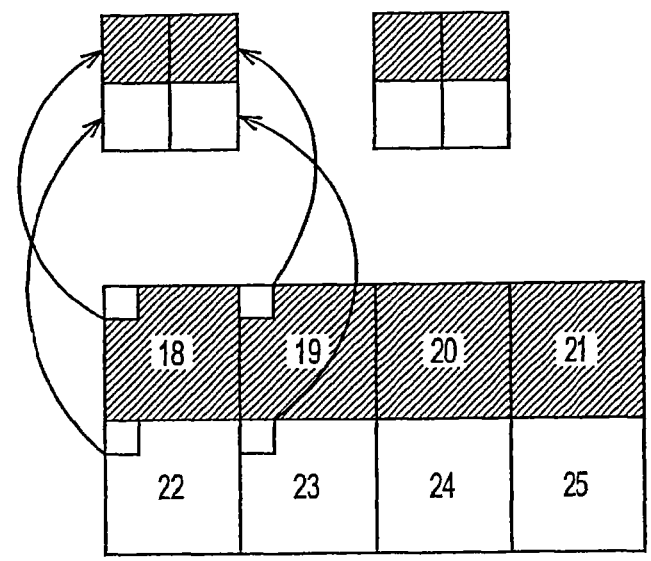
FIG. 22 is a diagram illustrating the operating principle for encoding the residual components of the chrominance signal when a macroblock is subjected to field-based encoding.
Figure 23:
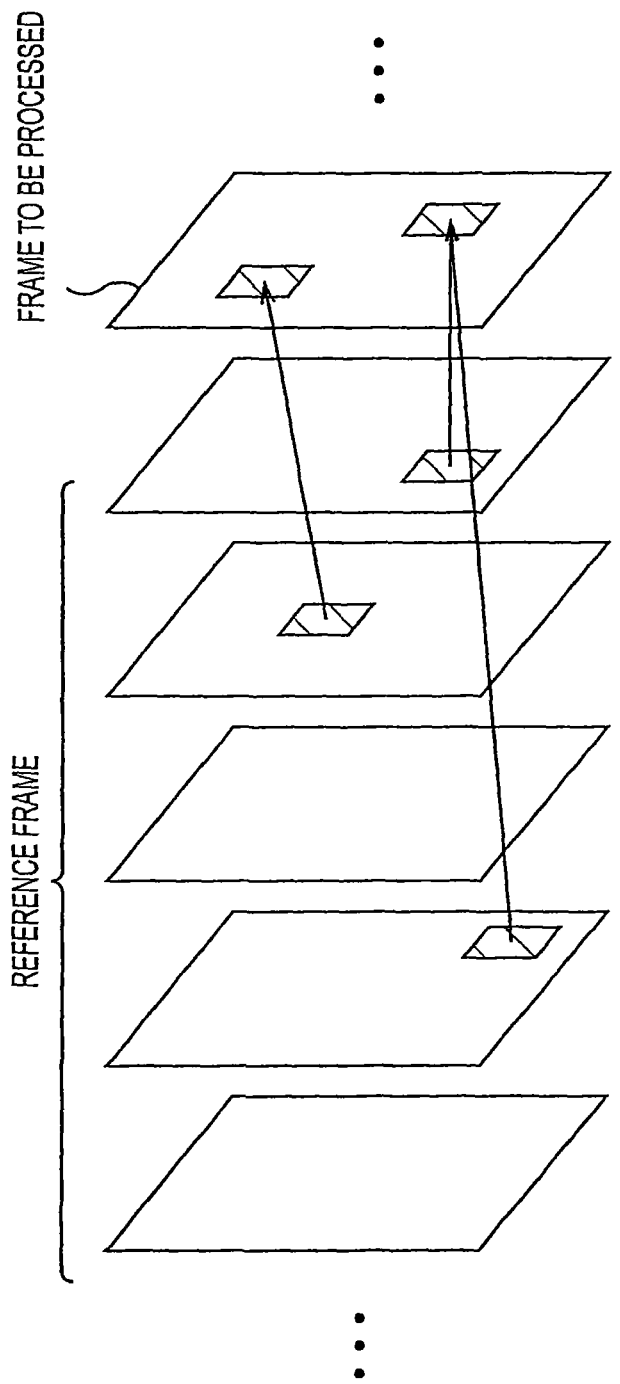
FIG. 23 is a diagram illustrating a multiple-frame prediction specified in H.26L.

The operating principle of the arithmetic coding section 58 will now be described with reference to FIG. 27. FIG. 27 shows an example structure of the arithmetic coding section 58. From among the syntax elements of the input image compression information, the frame/field flag shown in FIG. 16 is first encoded by a frame/field flag context model 91 in the arithmetic coding section 58.

When the macroblock to be processed is subjected to frame-based encoding, a frame-based context model 92, specified in the current H.26L standard, is applied. For syntax elements having a non-binarized value, such a value is binarized by a binarization section 93 and arithmetic coding is then applied.

On the other hand, when the macroblock to be processed is subjected to field encoding, a field-based context model 94 is applied for the syntax elements described below. For syntax elements having a non-binarized value, such a value is binarized by a binarization section 95 and arithmetic coding is then applied. More specifically, the first syntax element is MB_type for the I picture, the second syntax element is MB_type for the P/B picture, the third syntax element is motion vector information, the fourth syntax element is a reference field parameter, and the fifth syntax is an intra-prediction mode.

Figure 1:
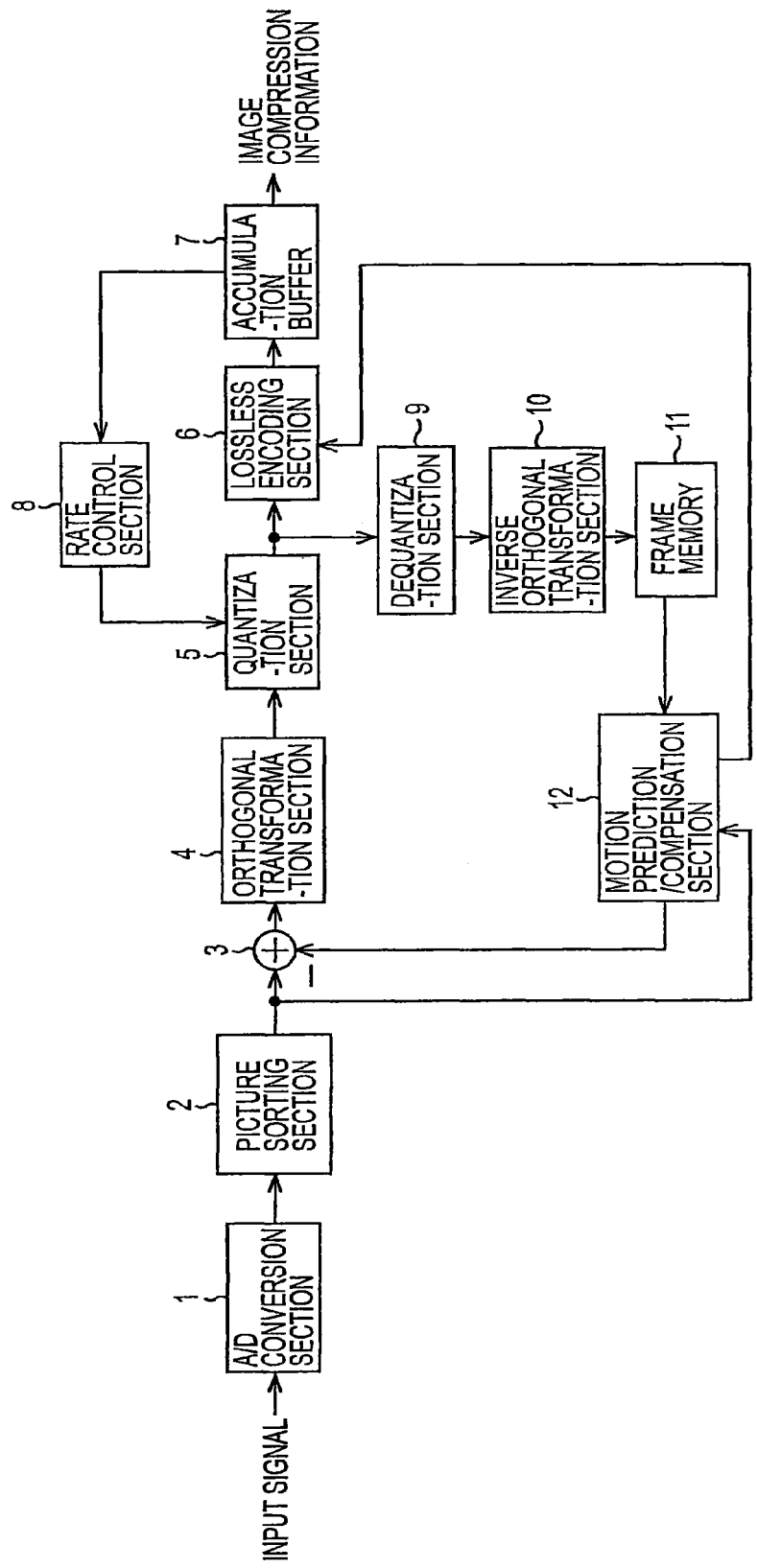
FIG. 1 is a block diagram showing the structure of a known image information encoding apparatus for carrying out image compression by orthogonal transformation and motion compensation.
Figure 2:
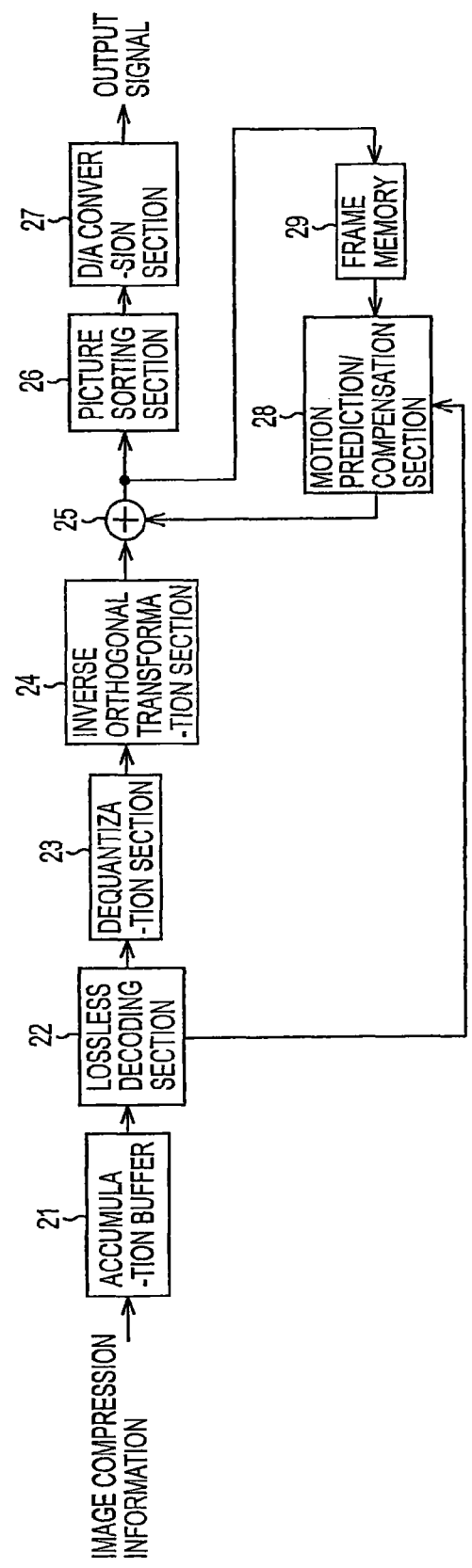
FIG. 2 is a block diagram showing the structure of an image information decoding apparatus corresponding to the image information encoding apparatus in FIG. 1.
Figure 4:
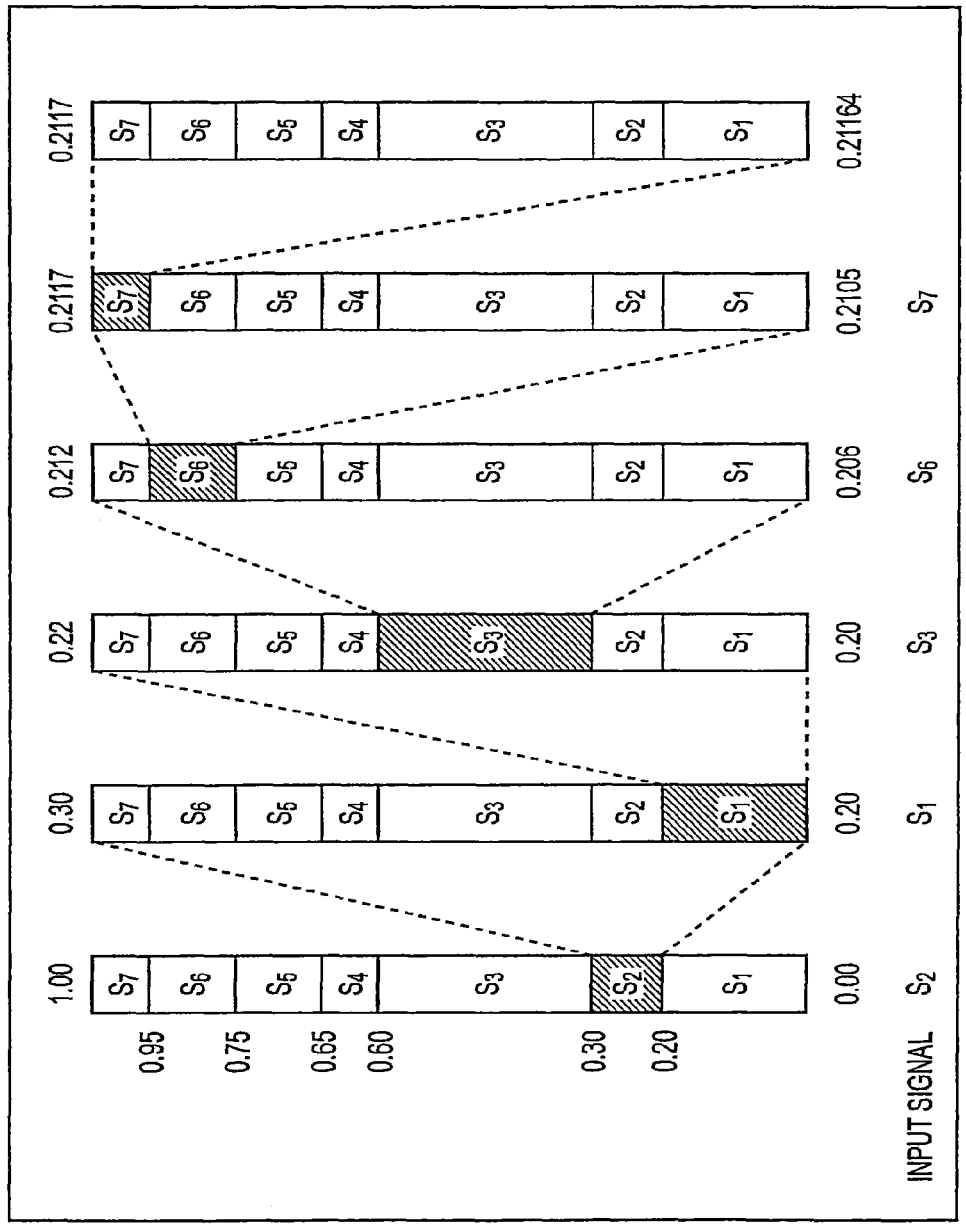
FIG. 4 is a diagram showing an example of arithmetic coding.
Figure 5:
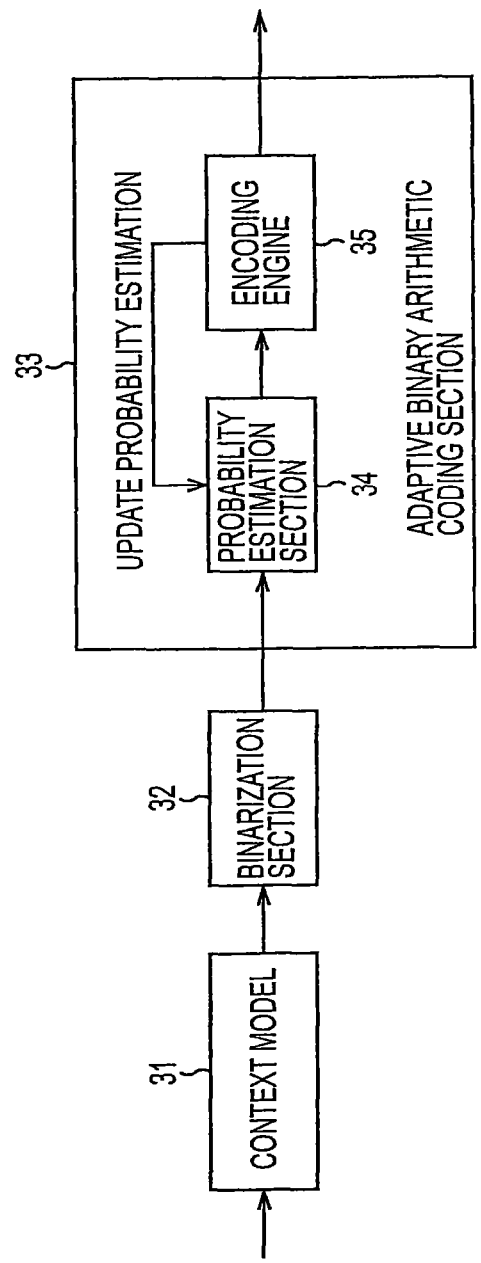
FIG. 5 is a block diagram showing a typical structure of a CABAC encoder.
Figure 6:
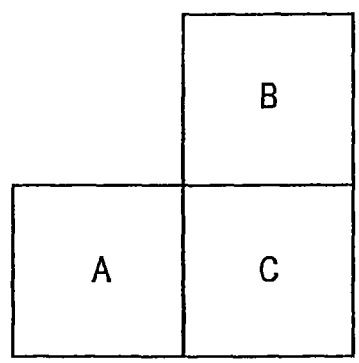
FIG. 6 is a diagram illustrating a context model for MB_type.
Figure 7:
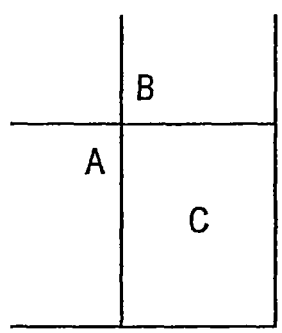
FIG. 7 is a diagram illustrating a context model for motion vector information MVD.
Figure 8:
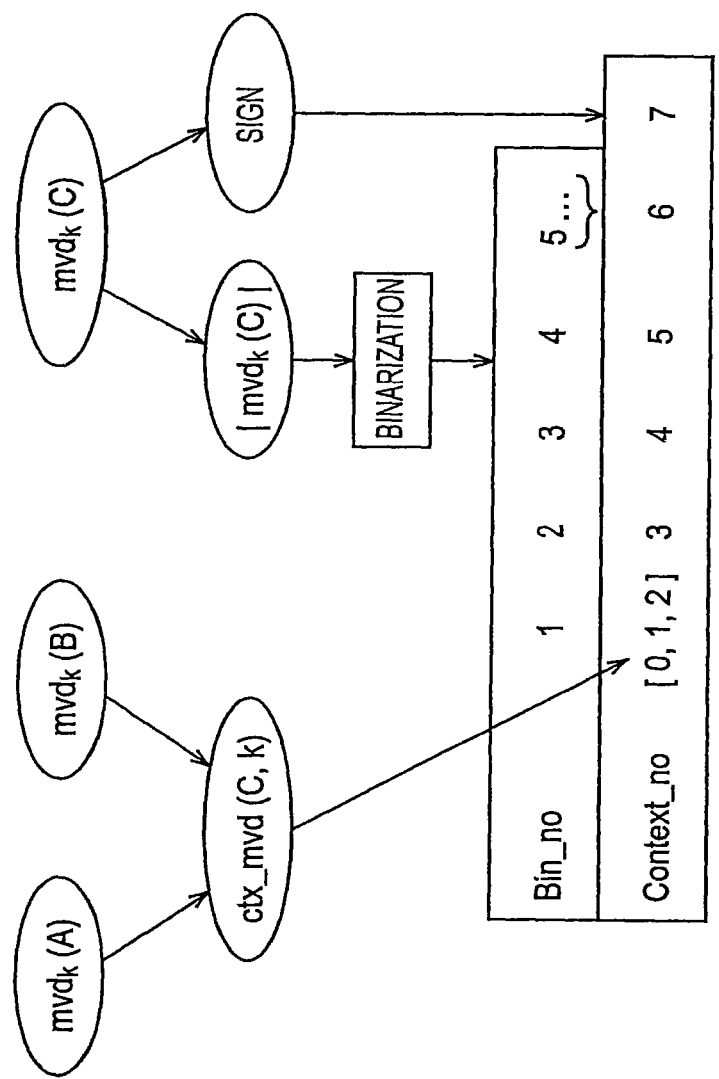
FIG. 8 is a diagram illustrating the encoding of motion vector information MVD based on a context model.
Figures 9, 10:
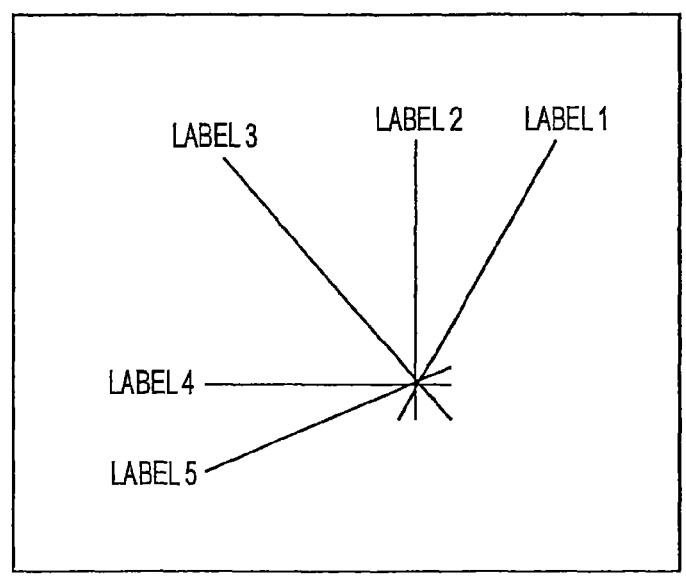
FIG. 9 is a diagram illustrating an intra-prediction mode defined in H.26L.
FIG. 10 is a diagram illustrating the directions of the intra-prediction modes indicated by labels 1 to 5.
Figure 11A:
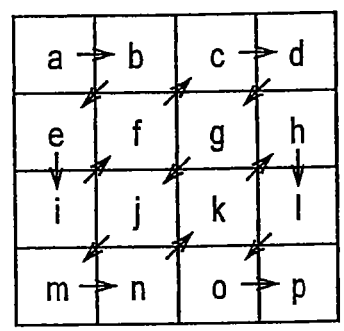
FIG. 11A is a diagram illustrating the single scan technique defined in H.26L.
Figure 11B:
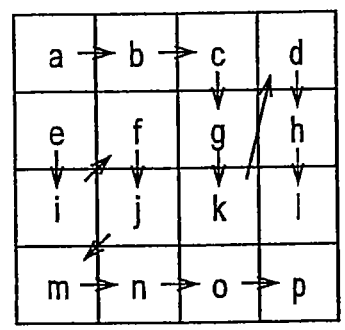
FIG. 11B is a diagram illustrating the double scan technique defined in H.26L.

The following description assumes that the macroblocks A, B, and C are arranged as shown in FIG. 6. Context models related to the frame/field flag will now be described. The context model $ctx\_fifr\_flag(C)$ related to the frame/field flag of the macroblock C is defined according to Expression (21) shown below.

$$ctx\_fifr\_flag(C) = a + 2b \quad (21)$$

In Expression (21), a and b are the values of the frame/field flags of the macroblocks A and B, respectively.

Context models related to MB_type for the I picture will now be described. When the frame/field flag is 1, the context model $ctx\_mb\_type\_intra\_field(C)$ corresponding to the MB_type of the macroblock C included in the I picture is defined according to Expression (22) shown below, as with Expression (3).

$$ctx\_mb\_type\_intra\_field(C) = A + B \quad (22)$$

A and B in Expression (22) are the same as the respective counterparts in Expression (3). It does not matter whether the neighboring macroblocks A and B are subjected to field-based encoding or frame-based encoding.

Context models related to the MB_type for the P/B picture will now be described. When the macroblock C is included in the P picture, the context model $ctx\_mb\_type\_inter\_field(C)$ corresponding to the MB_type of the macroblock C is defined according to Expression (23) shown below. Furthermore, when the macroblock C is included in the B picture, the context model $ctx\_mb\_type\_inter\_field(C)$ corresponding to the MB_type of the macroblock C is defined according to Expression (24) shown below.

$$ctx\_mb\_type\_inter\_field(C) = ((A == skip)?0:1) + 2((B == skip)?0:1) \quad (23)$$

$$ctx\_mb\_type\_inter\_field(C) = ((A == Direct)?0:1) + 2((B == Direct)?0:1) \quad (24)$$

The operators ((A==skip)?0:1) and ((A==skip)?0:1) in Expression (23) are the same as those in Expression (4) and the operators ((A==Direct)?0:1) and ((B==Direct)?0:1) in Expression (24) are the same as those in Expression (5). It does not matter whether the neighboring macroblocks A and B are subjected to field-based encoding or frame-based encoding.

The MB_type of a non-binarized P picture is binarized according to the table shown in FIG. 28A. Furthermore, the MB_type of a non-binarized B picture is binarized according to the table shown in FIG. 28B.

In an adaptive binary arithmetic coding section 96, the binarized symbol is subjected to probability estimation by a probability estimation section 97, and is subjected to adaptive arithmetic coding based on probability estimation by the encoding engine 98. The related models are updated after the adaptive arithmetic coding processing. This enables each model to carry out encoding processing according to the statistics of actual image compression information.

For a macroblock that is subjected to frame-based encoding, ten types of MB_type are defined if the macroblock belongs to the P picture. On the other hand, for a macroblock that is subjected to field-based encoding, the 16×16 mode and the 8×16 mode of the above-described 16 types of models are not defined if the macroblock belongs to the P picture. In short, eight types of MB_type are defined for a P-picture-related macroblock that is subjected to field-based encoding.

Eighteen types of MB_type are defined for a B-picture-related macroblock that is subjected to frame-based encoding. On the other hand, for a macroblock that is subjected to field-based encoding and belongs to the B picture, the forward 16×16 mode, backward 16×16 mode, forward 8×16 mode, and backward 8×16 mode from among the above-described 18 types of modes are not defined. In short, for a B-picture-related macroblock that is subjected to field-based encoding, 14 types of MB_type are defined.

Context models for motion vector information will now be described. When the value of the frame/field flag is 1, the first to third context models ctx_mvd_field(C,k) corresponding to the motion vector information of the macroblock C are defined according to Expressions (25-1) to (25-3) shown below.

$$\text{ctx\_mvd\_field}(C,k)=0 \quad e_k(C)<3 \tag{25-1}$$

$$\text{ctx\_mvd\_field}(C,k)=1 \quad 32<e_k(C) \tag{25-2}$$

$$\text{ctx\_mvd\_field}(C,k)=2 \quad 3\le e_k(C)\le 32 \tag{25-3}$$

In Expressions (25-1) to (25-3), the evaluation function $e_k$ is defined according to Expression (26) shown below. The macroblocks A and B exist in the same parity field.

$$e_k(C)=|mvd_k(A)|+|mvd_k(B)| \tag{26}$$

If the macroblock A has been subjected to frame-based encoding, $mvd_{1\_field}(A)$ calculated from Expression (27) shown below is applied to Expression (26) for the motion vector information $mvd_1(A)$ for the vertical direction component. This is also applicable when the macroblock B has been subjected to frame-based encoding.

$$mvd_{1\_field}(A)=mvd_{1\_frame}(A)/2 \tag{27}$$

In contrast, if the macroblock C is subjected to frame-based encoding and the neighboring block A has been subjected to field-based encoding, $mvd_{k\_frame}(A)$ calculated from Expressions (28-1) and (28-2) is applied to Expression (26) respectively for the horizontal direction component and the vertical direction component of $mvd_k(A)$.

$$mvd_{0\_frame}(A)=(mvd_{0\_top}(A)+mvd_{0\_bottom}(A))/2 \tag{28-1}$$

$$mvd_{1\_top}(A)+mvd_{1\_bottom}(A) \tag{28-2}$$

Context models related to the reference field parameter will now be described. When the value of the frame/field flag is 1, the first context model ctx_ref_field_top(C) corresponding to the first field is defined according to Expression (29-1) shown below. Furthermore, the first context model ctx_ref_field_bot(C) corresponding to the second field is defined according to Expression (29-2) shown below.

$$\text{ctx\_ref\_field\_top}(C)=a_t+2b_t \tag{29-1}$$

$$\text{ctx\_ref\_field\_bot}(C)=a_b+2b_b \tag{29-2}$$

In Expressions (29-1) to (29-2), the parameter $a_t$ is related to the first field of the neighboring macroblock A, the parameter $a_b$ is related to the second field of the neighboring macroblock A, the parameter $b_t$ is related to the first field of the neighboring macroblock B, and the parameter $b_b$ is related to the second field of the neighboring macroblock B, as defined in Expressions (30-1) and (30-2) shown below.

$$a_t,a_b,b_t,b_b=0$$

(when the reference field is the immediate previous encoded field) (30-1)

$$a_t,a_b,b_t,b_b=1 \text{ (otherwise)} \tag{30-2}$$

Context models corresponding to the second bin and the subsequent bins are each defined in the same manner as with the context model ctx_ref_frame(C) shown in Expression (8). It is noted, however, that the Code number to be encoded is not assigned to a frame but to a field.

Context models related to an intra-prediction mode will now be described. When the value of the frame/field flag is 1, the context model ctx_intra_pred_field(C) related to the intra-prediction mode corresponding to the macroblock C is defined in the same manner as with the context model ctx_intra_pred(C) for the macroblock in the frame mode. It does not matter whether the neighboring macroblocks A and B are subjected to field-based encoding or to frame-based encoding.

As described above, field/frame encoding using the CABAC scheme is made possible by introducing new context models and changing existing context models.

FIG. 29 shows an example structure of an image information decoding apparatus corresponding to the image information encoding apparatus in FIG. 26.

In the relevant image information decoding apparatus, an accumulation buffer 101 accumulates input image compression information and outputs it to an arithmetic decoding section 102, as required. The arithmetic decoding section 102 applies arithmetic decoding processing to the image compression information encoded based on the CABAC scheme, outputs the decoded frame/field flag to field/frame conversion sections 105 and 110, outputs the quantized orthogonal transform coefficient to a dequantization section 103, and outputs the prediction mode information and the motion vector information to a motion prediction/compensation section 111.

The dequantization section 103 dequantizes the quantized orthogonal transform coefficient decoded by the arithmetic decoding section 102. An inverse orthogonal transformation section 104 applies inverse orthogonal transformation to the dequantized orthogonal transform coefficient. If the macroblock to be processed has been subjected to field-based encoding, the field/frame conversion section 105 converts the output image or differential image obtained as a result of inverse orthogonal transformation into a frame structure.

If the macroblock to be processed is an inter-macroblock, an adder 106 combines the differential image from the inverse orthogonal transformation section 104 and the reference image from the motion prediction/compensation section 111 to generate an output image. A picture sorting buffer 107 rearranges the output images according to the GOP structure of the input image compression information and outputs it to a D/A conversion section 108. The D/A conversion section 108 converts the output image as a digital signal into an analog signal and outputs it to the subsequent stage.

A frame memory 109 stores the image information generated by the adder 106, i.e., the image information from which a reference image is generated. When the macroblock to be processed has been subjected to field-based encoding, the field/frame conversion section 110 converts the image information stored in the frame memory 111 into a field structure. The motion prediction/compensation section 111 generates a reference image from the image information stored in the frame memory based on the prediction mode information and the motion vector information for each macroblock included in the image compression information, and outputs the reference image to the adder 106.

According to the image information decoding apparatus constructed as described above, image compression information output by the image information encoding apparatus in FIG. 26 can be decoded into the original image information.

The sequence of processing described above can be implemented using not only hardware but also software. If the sequence of processing is to be implemented using software, a program constituting the software is installed from, for example, a recording medium 67 in FIG. 26 to a computer built into dedicated hardware or to, for example, a general-purpose personal computer that requires programs to be installed to carry out the corresponding functions.

The recording medium 67 may be a package medium including a magnetic disk (including a flexible disk); an optical disk (including a compact disc-read only memory, i.e., CD-ROM and a digital versatile disk, i.e., DVD); a magneto-optical disk (including a mini-disc, i.e., MD); or a semiconductor memory if such a program is supplied separately from a user's computer. The recording medium may be a ROM or a hard disk of a user's computer if the program on the recording medium is supplied preinstalled on the user's computer.

In the present invention, the steps of programs recorded on the recording medium may or may not be followed time-sequentially in order of the described steps. Furthermore, the steps may be followed in parallel or independently from one another.

INDUSTRIAL APPLICABILITY

As described above, according to the present invention, field/frame encoding using the CABAC scheme can be carried out even when input image information has an interlaced scan format.

Furthermore, according to the present invention, it is possible to restore image information in an interlaced scan format by decoding compression image information having image information of interlaced scan format subjected to field/frame encoding using the CABAC scheme at the macroblock level.

The invention claimed is:

1. An encoding method for adaptively carrying out field-based or frame-based encoding processing at a macroblock level with image information as an input, the encoding method comprising:

generating a context model corresponding to motion vector information of a current macroblock, wherein the context model is generated based on a sum of absolute values of motion vector information of macroblocks neighboring the current macroblock, and when the current macroblock is subjected to the frame-based encoding and a neighboring macroblock is subjected to field-based encoding, calculating the motion vector information corresponding to the neighboring macroblock by converting a vertical component of the motion vector information corresponding to the neighboring macroblock to an equivalent for frame-based encoding, and applying the motion vector information corresponding to the neighboring macroblock to the context model corresponding to the motion vector information of the current macroblock; and carrying out the encoding processing using the context model corresponding to the motion vector information of the current macroblock generated in the generating step.

2. An encoding apparatus for adaptively carrying out field-based or frame-based encoding processing at a macroblock level with image information as an input, the encoding apparatus comprising:

a processor configured to generate a context model corresponding to motion vector information of a current macroblock, wherein the context model is generated based on a sum of absolute values of motion vector information of macroblocks neighboring the current macroblock, and when the current macroblock is subjected to the frame-based encoding and a neighboring macroblock is subjected to field-based encoding, the processor is configured to calculate the motion vector information corresponding to the neighboring macroblock by converting a vertical component of the motion vector information corresponding to the neighboring macroblock to an equivalent for frame-based encoding, and to apply the motion vector information corresponding to the neighboring macroblock to the context model corresponding to the motion vector information of the current macroblock; and an encoder configured to carry out the encoding processing using the context model corresponding to the motion vector information of the current macroblock generated by the processor.

\* \* \* \* \*